US012805167B2

(12) United States Patent
Chen

(10) Patent No.: US 12,805,167 B2
(45) Date of Patent: Nov. 17, 2026

(54) OPTICAL COMPENSATION FILM

(71) Applicant: Ytdiamond Co., Ltd., Taoyuan (TW)

(72) Inventor: Ying-Tung Chen, Taoyuan (TW)

(73) Assignee: YTDIAMOND CO., LTD., Taoyuan City (TW)

( * ) Notice: Subject to any disclaimer, the term of this patent is extended or adjusted under 35 U.S.C. 154(b) by 339 days.

(21) Appl. No.: 18/509,373

(22) Filed: Nov. 15, 2023

(65) Prior Publication Data

US 2025/0048896 A1 Feb. 6, 2025

(30) Foreign Application Priority Data

Aug. 1, 2023 (TW) ................................ 112128800

(51) Int. Cl.
*H10K 59/80* (2023.01)
*H10K 102/00* (2023.01)

(52) U.S. Cl.
CPC ....... *H10K 59/879* (2023.02); *H10K 59/8791* (2023.02); *H10K 2102/311* (2023.02)

(58) Field of Classification Search
CPC .. H10K 59/879; H10K 59/8791; G02B 5/045; G02B 5/06
See application file for complete search history.

(56) References Cited

U.S. PATENT DOCUMENTS 11,226,433 B2 * 1/2022 Yapel ....................... G02B 1/10
11,796,151 B2 * 10/2023 Chen .................... G02B 5/0268
(Continued)

FOREIGN PATENT DOCUMENTS

CN 105929476 A 9/2016
JP 2010210904 A 9/2010
(Continued)

OTHER PUBLICATIONS

Taiwan Intellectual Property Office, Office Action, Application No. 112128800, Apr. 26, 2024, all pages. (Year: 2024).*
(Continued)

*Primary Examiner* — Victoria K. Hall
(74) *Attorney, Agent, or Firm* — BACON & THOMAS, PLLC

(57) ABSTRACT

An optical compensation film is provided. The optical compensation film includes a base and a first optical structure. The first optical structure includes a first high refractive index layer and a first low refractive index layer jointly arranged at the same side of the base. The first high refractive index layer is disposed downstream of the first low refractive index layer on an optical path of a light beam of a light-emitting assembly and includes a plurality of first microstructures at a first textured surface facing toward the first low refractive index layer. One of the first microstructures includes a plurality of first inclined surfaces, two opposite ones of which form a first angle therebetween. The first angle θ1, a refractive index $n_{H1}$ of the first high refractive index layer, and a refractive index $n_{L1}$ of the first low refractive index layer satisfy the following equation: $|\theta1-(180-2*(\arcsin(n_{L1}/n_{H1})*180/\pi))|\leq 10$.

19 Claims, 13 Drawing Sheets

(56) References Cited

U.S. PATENT DOCUMENTS

| | | | | |
|---|---|---|---|---|
| 2013/0070341 A1* | 3/2013 | Yapel | G02B 5/0278 | |
| | | | 359/599 | |
| 2014/0370307 A1* | 12/2014 | Hao | G02B 5/0294 | |
| | | | 156/60 | |
| 2016/0252665 A1* | 9/2016 | Lee | G02B 1/14 | |
| | | | 359/489.07 | |
| 2021/0072600 A1* | 3/2021 | Jang | G02F 1/133514 | |
| 2024/0177658 A1* | 5/2024 | Lee | G09G 3/3225 | |

FOREIGN PATENT DOCUMENTS

| | | |
|---|---|---|
| KR | 101871552 B | 6/2018 |
| TW | 201334970 A | 9/2013 |

OTHER PUBLICATIONS

Office Action issued on Sep. 15, 2025 in corresponding Chinese application No. 202310955049.1.

* cited by examiner

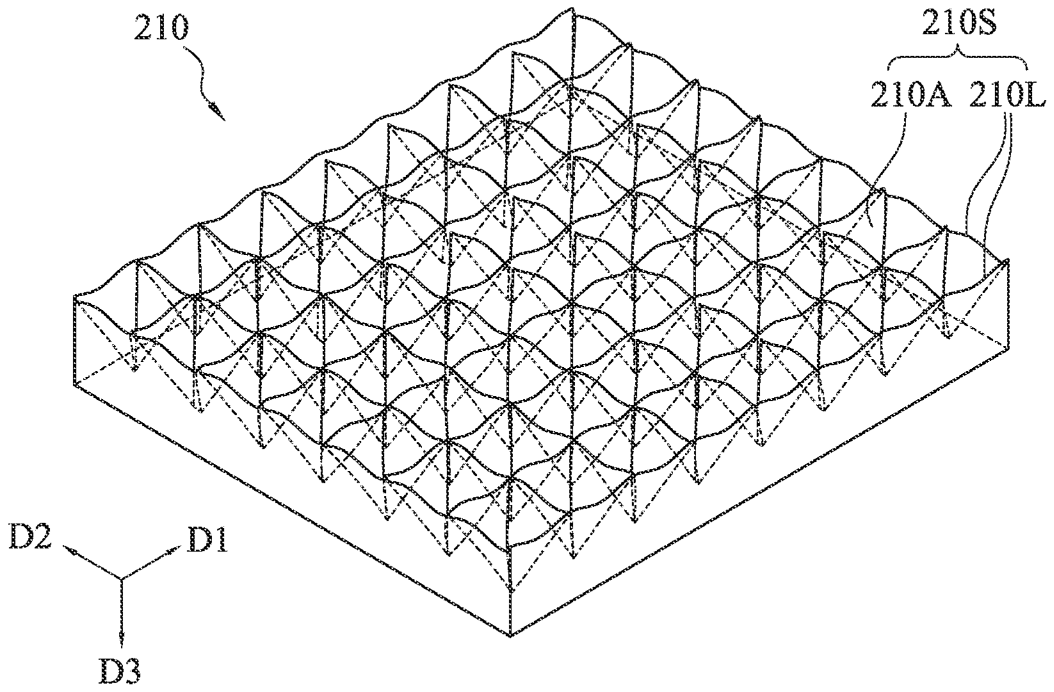
Fig. 5
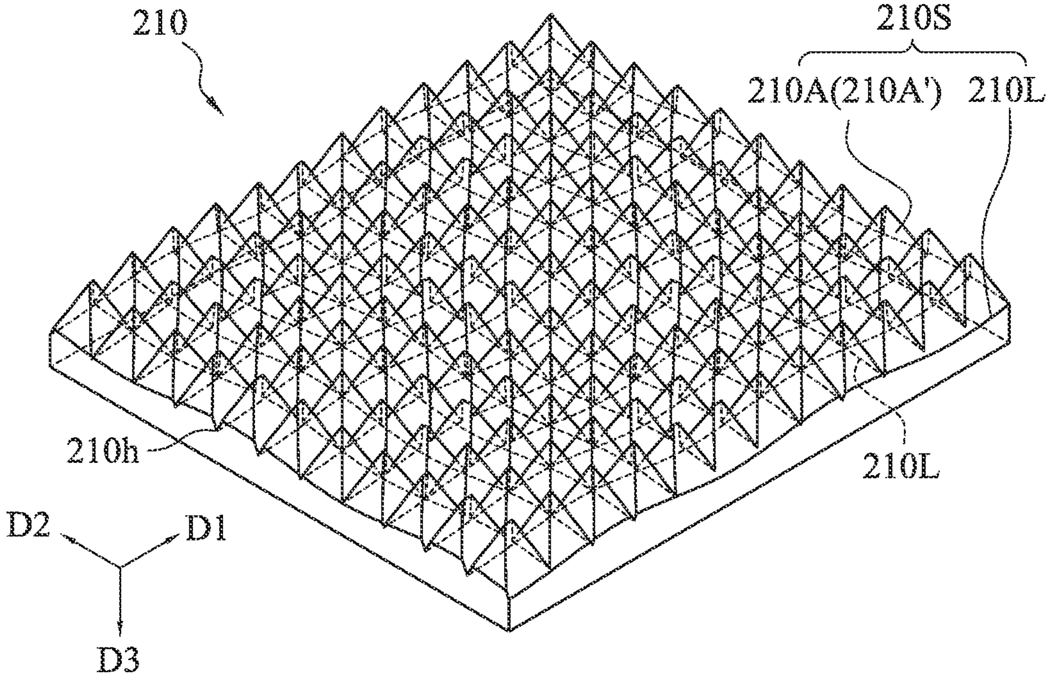
Fg. 6

OPTICAL COMPENSATION FILM

CROSS-REFERENCE

This application claims the benefit of priority to Taiwan Patent Application No. 112128800, filed on Aug. 1, 2023. The entire content of the above identified application is incorporated herein by reference.

TECHNICAL FIELD

The present disclosure relates to an optical film, and more particularly to an optical compensation film for improving the color shift issue of an organic light-emitting diode (OLED) display or illumination apparatus.

BACKGROUND

Since an organic light-emitting diode (OLED) has advantages, such as self-luminous, short response time, high brightness, high lumen efficiency, a low operating voltage, a small thickness, flexibility, and so on, it can be applied in display or illumination apparatus.

A conventional OLED display or illumination apparatus usually includes a plurality of sub-pixels used to respectively generate different color light beams (such as red light beam, blue light beam, and green light beam) for being mixed to form a white light beam. Light emission angles of different color light beams may be mismatched due to different arrangements of different sub-pixels. As a viewing angle of a viewer increases, color shift may occur in a displayed image of the OLED display or illumination apparatus.

On the other hand, some OLED display apparatus are designed to improve optical efficiency by utilizing a micro-cavity resonance effect. However, it causes that intensity and a wavelength of the light beam emitted by OLED are highly correlated with an emission angle. As the viewing angle of the viewer increases, an emission spectrum of an individual sub-pixel would shift toward a shorter wavelength, which is also called as blue shift. To be more specific, compared to the green sub-pixel, the light intensities of red and blue sub-pixels in their angular emission distributions decline faster as the viewing angle increases, a white point displayed by OLED display or illumination apparatus would look greenish at a large viewing angle.

Based on similar reasons, a flexible OLED display or illumination apparatus may also have the color shift issue. Specifically, when the flexible OLED display or illumination apparatus is bent, the color shift occurs in the edge region of the displayed image of the flexible OLED display or illumination apparatus.

Accordingly, how the color shift in the displayed image of the OLED display or illumination apparatus at a large viewing angle can be reduced and how the color shift occurring in the edge region of the displayed image can be improved while the flexible OLED display or illumination apparatus is bent are still issues to be solved in the relevant industry.

SUMMARY OF THE INVENTION

In response to the technical inadequacies, an optical compensation film is provided to reduce the color shift in the image while the viewing angle increases, thus improving the quality of a displayed image.

According to one aspect of the present disclosure, an optical compensation film is provided and includes a base and a first optical structure. The first optical structure includes a first high refractive index layer and a first low refractive index layer that are jointly located at a first side or a second side of the base. The first high refractive index layer is disposed downstream of the first low refractive index layer on an optical path of a light beam generated by a light-emitting assembly. The first high refractive index layer includes a plurality of first boundary lines at a first textured surface facing toward the first low refractive index layer, and the first boundary lines intersect with one another to define a plurality of first regions. The first regions are formed with a plurality of first microstructures, respectively. At least one of the first microstructures includes a plurality of first inclined surfaces, and two opposite ones of the first inclined surfaces form a first angle therebetween. The first angle, a refractive index of the first high refractive index layer, a refractive index of the first low refractive index layer satisfy the following equation: $|\theta 1-(180-2*(\arcsin(n_{L1}/n_{H1})*180/\pi))|\leq 10$, in which θ1 represents the first angle, $n_{H1}$ represents the refractive index of the first high refractive index layer, and $n_{L1}$ represents the refractive index of the first low refractive index layer.

According to another aspect of the present disclosure, an optical compensation film is provided and includes a base and a first optical structure. The first optical structure includes a first high refractive index layer and a first low refractive index layer that are jointly located at a first side or a second side of the base. The first high refractive index layer is disposed downstream of the first low refractive index layer on an optical path of a light beam generated by a light-emitting assembly. The first high refractive index layer is formed with a plurality of first microstructures at a first textured surface facing toward the first low refractive index layer. The first microstructures define a plurality of recessed spaces, and the first low refractive index layer fills the recessed spaces. The first low refractive index layer defines at least one cavity in the first optical structure or has a porous structure. At least one of the first microstructures includes at least two first inclined surfaces oppositely arranged and forming a first angle therebetween. The first angle ranges from 80 degrees to 120 degrees.

According to yet another aspect of the present disclosure, an optical compensation film film is provided and includes a base, a first optical structure, and a second optical structure. The first optical structure is located at one side of the base and includes a first high refractive index layer and a first low refractive index layer. The first high refractive index layer is disposed downstream of the first low refractive index layer on an optical path of a light beam generated by a light-emitting assembly. The first high refractive index layer includes a plurality of first microstructures at a first textured surface facing toward the first low refractive index layer. At least one of the first microstructures includes at least two first inclined surfaces. The second optical structure is located at another side of the base and includes a second high refractive index layer and a second low refractive index layer. The second high refractive index layer is disposed downstream of the second low refractive index layer on the optical path. The second low refractive index layer includes a plurality of second microstructures at a second textured surface facing toward the second high refractive index layer, and at least one of the second microstructures includes at least two second inclined surfaces. The inclined directions of the at least two second inclined surfaces are different from an inclined direction of any one of the at least two first inclined surfaces. The two first inclined surfaces jointly form a first angle therebetween. The first angle, a refractive index of the first high refractive index layer, and a refractive index of the first low refractive index layer satisfy following equation: $|\theta 1-(180-2*(\arcsin(n_{L1}/n_{H1})*180/\pi))|\leq 10$, in which θ1 represents the first angle, $n_{H1}$ represents the refractive index of the first high refractive index layer, and $n_{L1}$ represents the refractive index of the first low refractive index layer.

One of advantages of the present disclosures is that the optical compensation film provided in the present disclosure, by virtue of "the first high refractive index layer being disposed downstream of the first low refractive index layer on an optical path of a light beam generated by a light-emitting assembly" and "at least one of the first microstructures having two opposite ones of the first inclined surfaces that form the first angle θ1 therebetween, in which the first angle θ1, the refractive index $n_{H1}$ of the first high refractive index layer, the refractive index $n_{L1}$ of the first low refractive index layer satisfy following equation: $|\theta 1-(180-2*(\arcsin(n_{L1}/n_{H1})*180/\pi))|\leq 10$," the color shift in an image at a large viewing angle can be reduced, thus improving quality of a displayed image.

The advantages of the present disclosure compared with the prior art have been described above, and those skilled in the art can better understand other benefits and other purposes of the present disclosure defined in the claims after reading the specification. In order to further understand features and technical contents of the present disclosure, the detailed description and drawings of the present disclosures are provided for reference, however, the provided drawings are merely for reference and illustration, and not intended to limit the present disclosure.

BRIEF DESCRIPTION OF THE DRAWINGS

The optical compensation film of the present disclosure are described in details in the following descriptions with reference to preferred example embodiments and the accompanying drawings, and the drawings are not necessarily drawn to real scale, and thus the present disclosure is not limited to the scale in the drawings, in which:

FIG. 5 is a schematic perspective view of a part of a first high refractive index layer in accordance with another example embodiment;

FIG. 6 is a schematic perspective view of a part of a first high refractive index layer in accordance with another example embodiment;

DETAILED DESCRIPTION

The specific example embodiments of the present disclosure now will be described more fully hereinafter to explain the implementations of "optical compensation film" disclosed in the present disclosure, and those skilled in the art can understand the advantages and effects of the present disclosure from the contents disclosed in this specification. The present disclosure can be applied or exploited by virtue of other different example embodiments, and various modifications and changes may be made to the details in this specification based on different viewpoints and applications without departing from the concept of the present disclosure. The relevant technical content of the present disclosure will be further described in detail by the following example embodiments, but the disclosed contents are not intended to limit the scope of the present disclosure. In addition, the term "or" used herein may include any one or a combination of more of the associated listed items depending on the actual situation.

Figure 1:
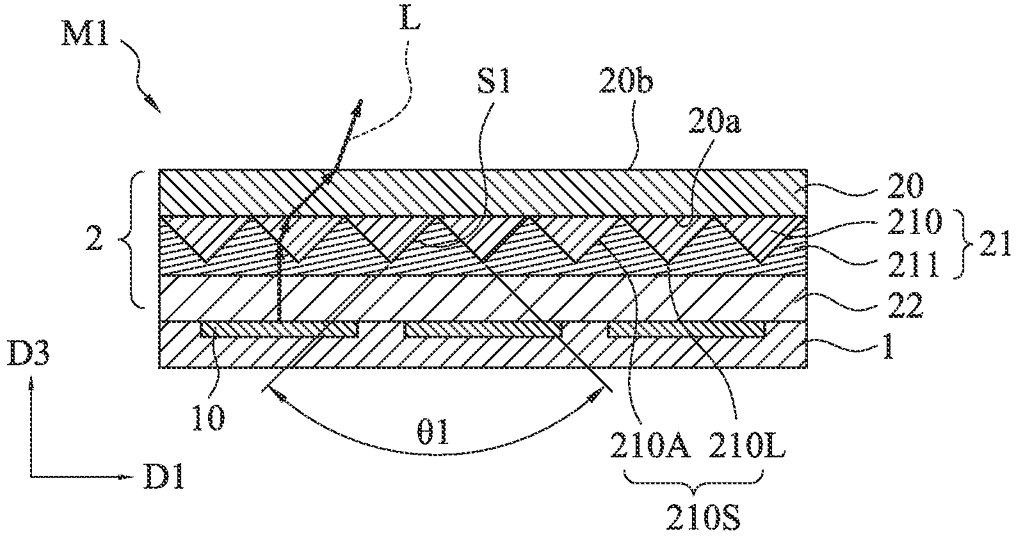
FIG. 1 is a schematic cross-sectional view of a light-emitting module in accordance with a first example embodiment of the present disclosure.

Reference is made to FIG. 1, which is a schematic cross-sectional view of a light-emitting module in accordance with a first example embodiment of the present disclosure. The light-emitting module M1 of the instant example embodiment can be applied in a display apparatus or an illumination apparatus. The aforementioned display apparatus or illumination apparatus can be a flexible display apparatus or a flexible illumination apparatus. The light-emitting module M1 can include a light-emitting assembly 1 and an optical compensation film 2. The light-emitting assembly can include a plurality of light-emitting units 10, and the light-emitting units 10 are arranged in an array to generate a point light source or a linear light source. In one example embodiment, the light-emitting unit is, for instance, an organic light-emitting diode (OLED).

The optical compensation film 2 can be arranged at a light emergent side of the light-emitting assembly 1, and at least includes a base 20 and a first optical structure 21. By using the optical compensation film 2 of the example embodiment of the present disclosure, the color shift in a displayed image of a display or illumination apparatus at large viewing angle can be reduced, and the quality of the displayed image can be improved. It should be noted that in the example embodiment shown in FIG. 1, the optical compensation film 2 is directly arranged on a light emergent surface of the light-emitting assembly 1. However, in another example embodiment, the other optical film can also be disposed between the optical compensation film 2 and the light-emitting assembly 1 according to practical implementations.

The base 20 has a first side 20*a* and a second side 20*b* that are opposite to each other. In the instant example embodiment, a material of the base 20 can be polyethylene terephthalate (PET), polystyrene (PS), polycarbonate (PC), polyethylene (PE), polypropylene (PP), polyvinyl chloride (PVC), polymethyl methacrylate (PMMA) or acrylic, methyl methacrylate (MMA), and so on.

In the instant example embodiment, the first optical structure 21 includes a first high refractive index layer 210 and a first low refractive index layer 211. The first high refractive index layer 210 and the first low refractive index layer 211 are jointly arranged at the first side 20*a* or the second side 20*b* of the base 20. In the instant example embodiment, the base 20 is arranged with the first side 20*a* facing toward the light-emitting assembly 1 and the second side 20*b* facing away from the light-emitting assembly 1, and the first high refractive index layer 210 and the first low refractive index layer 211 are jointly arranged at the first side 20*a* of the base 20, and the first high refractive index layer 210 is disposed downstream of the first low refractive index layer on an optical path of the light beam L generated by the light-emitting assembly 1. That is to say, a light beam L generated by the light-emitting assembly 1 passes through the first low refractive index layer 211 and then passes through the first high refractive index layer 210, which does not result in any total internal reflection. The first high refractive index layer 210 can also be made of the same material as that of the base 20.

Figure 2:
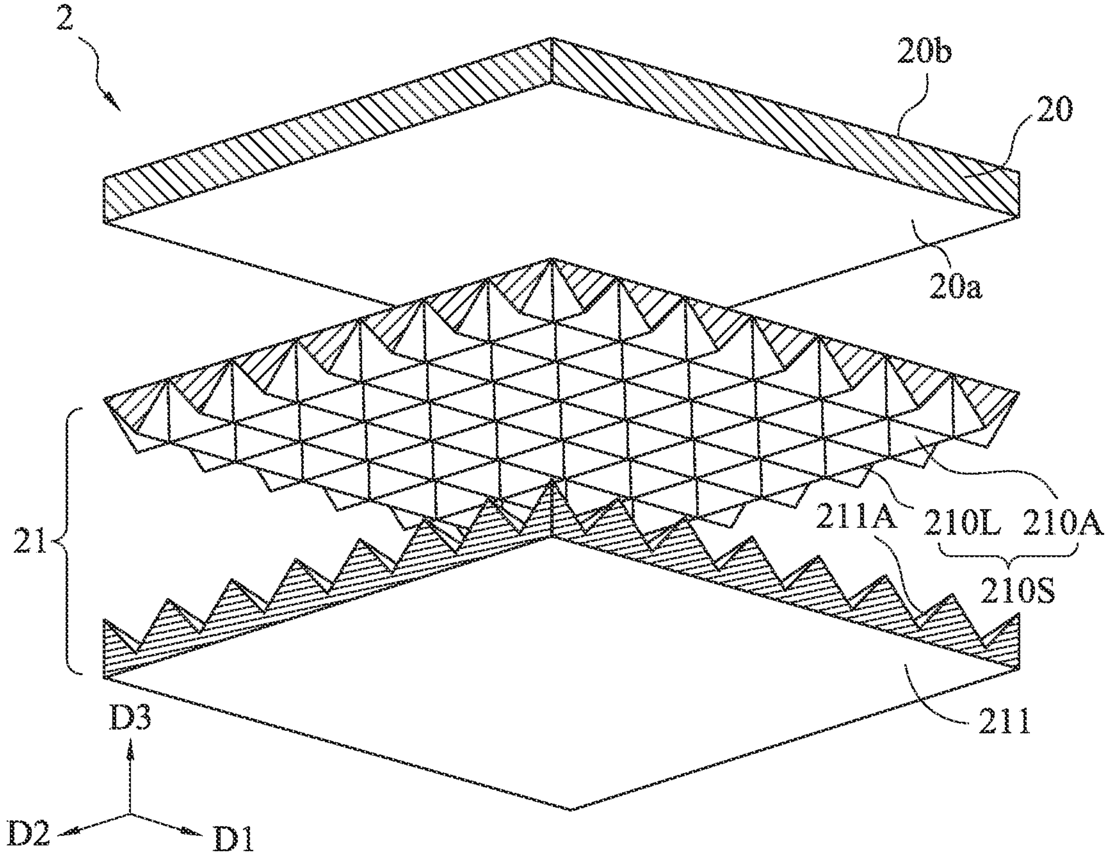
FIG. 2 is a schematic exploded perspective view of an optical compensation film in accordance with the first example embodiment of the present disclosure.

Reference is made to FIG. 1 and FIG. 2, in which FIG. 2 is a schematic exploded perspective view of an optical compensation film in accordance with the first example embodiment of the present disclosure, and an adhesive layer thereof is omitted. The first high refractive index layer 210 has a first textured surface 210S facing toward the first low refractive index layer 211 and a planar surface (not labeled) facing toward the base 20. The first textured surface 210S includes a plurality of first boundary lines 210L that intersect with one another. As shown in FIG. 2, a portion of the plurality of the first boundary lines 210L extend in a first direction D1, and another portion of the plurality of the first boundary lines 210L extend in a second direction D2 that is not parallel to the first direction D1. The plurality of first boundary lines 210L intersect with one another to define a plurality of first regions (not labeled). A contour of each of the first regions is formed in a polygon shape, and each of the first regions is formed with a first microstructure 210A. In other words, every two adjacent ones of the first microstructures 210A are jointly connected to one of the first boundary lines 210L.

In the instant example embodiment, the first microstructure 210A includes a plurality of first inclined surfaces S1 that are inclined relative to a thickness direction D3 of the base 20, and the first microstructure 210A can be a protruding microstructure or a recessed microstructure. Specifically, when the first microstructure 210A is a protruding microstructure, the first microstructure 210A protrudes outward relative to the first boundary line 210L to which the first microstructure 210A is connected and is oriented away from the base 20. When the first microstructure 210A is a recessed microstructure, the first microstructure 210A is depressed relative to the first boundary line 210L to which the first microstructure 210A is connected and is oriented toward the base 20. By having at least one of the first microstructures 210A have the first inclined surfaces S1 that are respectively inclined toward different directions, while passing through the optical compensation film 2, the light beams L generated by the light-emitting units 10 of the light-emitting assembly 1 would be refracted and dispersed by the first microstructures 210A and then mixed again in the base 20, such that the color shift at large viewing angle can be reduced.

Furthermore, the first microstructure 210A can be formed in a convex pyramidal shape, a convex prismatic shape, a concave pyramidal shape, or a concave prismatic shape. In the instant example embodiment, the first microstructure 210A is formed in a concave pyramidal shape. To be more specific, the first microstructure 210A is formed in a concave pyramid. Accordingly, at least one of the first microstructures 210A includes three or four first inclined surfaces S1 that are respectively inclined toward different directions, and each of the first inclined surfaces S1 is in a triangular shape.

It should be noted that a design concept of the optical compensation film 2 in the example embodiment of the present disclosure is different from those of other optical films which are applied to diffuse light. Based on actual test results, if the light beam L generated by the light-emitting assembly 1 is totally reflected in the first optical structure 21, a severe color shift occurs at a smaller viewing angle (i.e., 0 degree to 5 degrees), and a ghost image may be formed on the displayed image, which negatively affects the quality of the displayed image. In the present disclosure, the "viewing angle" is defined as an angle between a line of sight and a normal direction of the light emergent surface of the light-emitting assembly 1.

Accordingly, in the instant example embodiment, the light beam L generated by the light-emitting assembly 1 firstly passes through the first low refractive index layer 211, and then passes through the first high refractive index layer 210, thereby preventing the occurrences of the color shift at a smaller viewing angle and the ghost image. Furthermore, by having at least one of the first microstructures 210A include the first inclined surfaces S1 that are respectively inclined toward different directions, the different color light beams L generated by the light-emitting units 10 of the light-emitting assembly 1 can be dispersed by the first microstructures 210A and then mixed again in the base 20, such that the color shift while the displayed image is viewed at a larger viewing angle (greater than 60 degrees) can be further reduced.

As shown in FIG. 1 and FIG. 2, in the instant example embodiment, two opposite ones of the first inclined surfaces S1 form a first angle θ1 therebetween, and the first angle θ1 satisfies the following equation: $|\theta1-(180-2*(\arcsin(n_{L1}/n_{H1})*180/\pi))|\leq 10$, in which θ1 represents the first angle, $n_{H1}$ represents the refractive index of the first high refractive index layer 210, and $n_{L1}$ represents the refractive index of the first low refractive index layer 211.

It should be noted that since the ambient light passes through the first high refractive index layer 210, and then passes through the first low refractive index layer 211 when it enters into the first optical structure 21 from the base 20, it is possible for the ambient light to be totally reflected, such that a transparency of the optical compensation film 2 is decreased. A total internal reflection critical angle θc for light entering from the first high refractive index layer 210 to the first low refractive index layer 211, the refractive index $n_{H1}$ of the first high refractive index layer 210, and the refractive index $n_{L1}$ of the first low refractive index layer 211 satisfy the following equation: $\theta c=(\arcsin(n_{L1}/n_{H1})*(180/\pi)$. Accordingly, the aforementioned equation can be expressed as: $|(\theta 1-(180-2\theta c)|\leq 10$.

The optical compensation film 2 is tested by using the light-emitting assembly 1 including organic light-emitting diodes, and is inspected by human eyes. Based on an actual test result, when $(\theta 1-(180-2\theta c))<(-10)$, the color shift occurs even at the viewing angle of less than 5 degrees. For example, white presented in the displayed image turns dark green. Furthermore, when $10<(\theta 1-(180-2\theta c))$, the color shift almost does not occur at the viewing angle of less than 45 degrees. When the viewing angle is greater than 45 degrees, the color shift can be observed, but the extent of the color shift has been reduced. For example, when the viewing angle is greater than 45 degrees, it can be observed by human eyes that white presented in the displayed image turns into light green.

However, when $-10\leq(\theta 1-(180-2\theta c))\leq 10$, there is more significant effect on improvement of the color shift at a larger viewing angle (greater than 45 degrees). The color shift almost does not occur even when the viewing angle is greater than 80 degrees. Therefore, by having the first angle θ1 satisfy the equation, i.e., $|\theta 1-(180-2\theta c)|\leq 10$, an outstanding and substantial effect can be achieved. More preferably, when $|\theta 1-(180-2\theta c)|\leq 5$, a better effect for improving the color shift can be achieved.

Furthermore, in the instant example embodiment, by having the first angle θ1 satisfy the following equation: $(180-2*(\arcsin(n_{L1}/n_{H1})*180/\pi)<\theta 1$ (i.e., $(180-2\theta c)<\theta 1$), it is also possible to make the optical compensation film 2 have a relatively high transparency. That is to say, when $0<(\theta 1-(180-2\theta c))\leq 10$, not only the optical compensation film 2 can improve the color shift at a larger viewing angle, but also the transparency of the optical compensation film 2 would not be sacrificed.

In one example embodiment, a ratio of the refractive index $n_{L1}$ of the first low refractive index layer 211 to the refractive index $n_{H1}$ of the first high refractive index layer 210 (i.e., $n_{L1}/n_{H1}$) ranges from 0.8 to 0.95. The refractive index $n_{L1}$ of the first low refractive index layer 211 and the refractive index $n_{H1}$ of the first high refractive index layer 210 are both greater than 1, and the refractive index $n_{H1}$ of the first high refractive index layer 210 is greater than the refractive index $n_{L1}$ of the first low refractive index layer 211. Accordingly, the total internal reflection critical angle θc ranges from 53 degrees to 72 degrees, and the first angle θ1 ranges from 36 degrees and 74 degrees. If process constraints are further considered, the first angle θ1 would ranges between 40 degrees and 74 degrees.

In one preferred example embodiment, the first high refractive index layer 210 can be selected from one of materials having a refractive index $n_{H1}$ ranging from 1.58 to 1.7. The first high refractive index layer 210 can be a light cured layer, which may be made of, for example, polymethyl methacrylate (PMMA). Furthermore, the first low refractive index layer 211 can be selected from one of materials having a refractive index $n_{L1}$ ranging from 1.4 to 1.5. The first low refractive index layer 211 can be a flexible adhesive layer or a cured layer that can be cured by UV light or heat.

Figure 3:
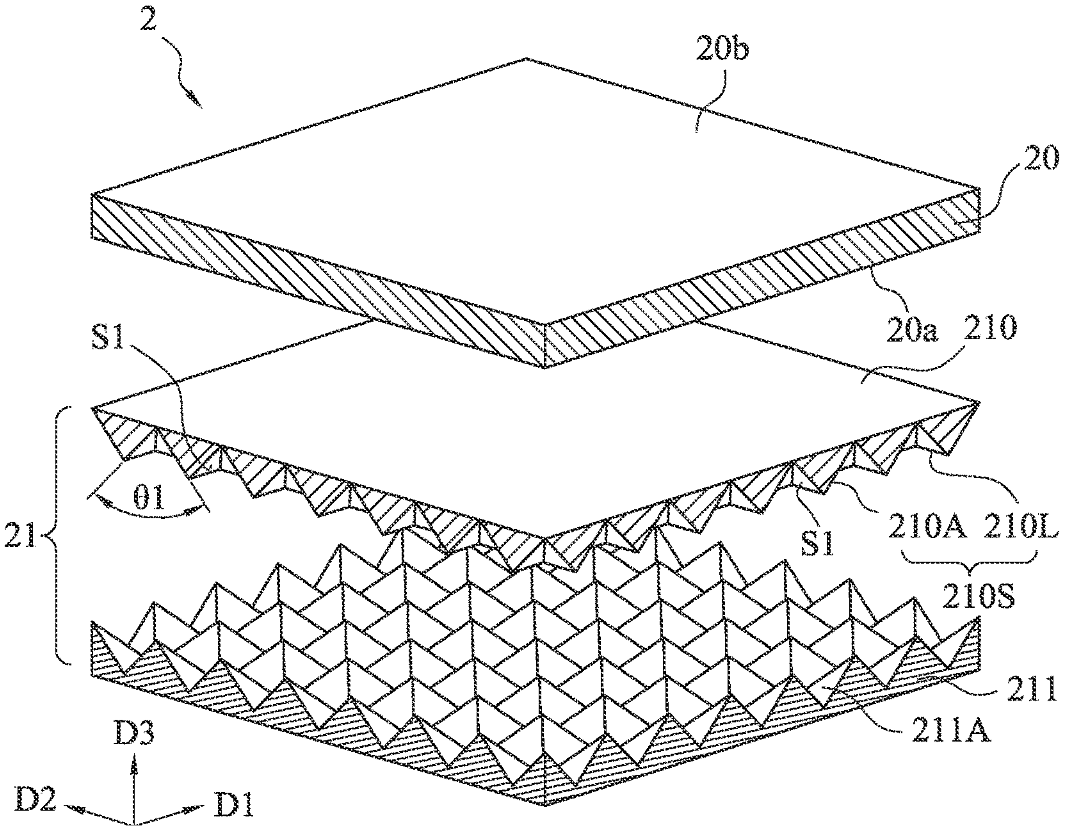
FIG. 3 is a schematic exploded perspective view of a part of the optical compensation film shown in FIG. 2 viewed from another angle.

Reference is made to FIG. 1 to FIG. 3. The first low refractive index layer 211 of the instant example embodiment is a light cured layer, and a portion of the first low refractive index layer 211 fills the recessed spaces defined by the first microstructures 210A. As shown in FIG. 3, a surface of the first low refractive index layer 211 facing toward the first high refractive index layer 210 includes a plurality of protruding microstructures 211A, and shapes of the protruding microstructure 211A can be mated with the first microstructures 210A. Since the first microstructure 210A of the instant example embodiment is formed in a concave pyramidal shape, the protruding microstructure 211A is formed in a convex pyramidal shape, but the present disclosure is not limited thereto.

Reference is made to FIG. 1. In the instant example embodiment, the optical compensation film 2 further includes an adhesive layer 22. The adhesive layer 22 is attached to a surface of the first low refractive index layer 211. The optical compensation film 2 can be connected to the light emergent surface of the light-emitting assembly 1 by the adhesive layer 22.

In another example embodiment, the first high refractive index layer 210 is a cured layer, and the first low refractive index layer is a flexible adhesive layer. An optical clear adhesive with a relatively low refractive index, such as silicone can be selected to be used as the flexible adhesive layer. For example, the refractive index of the flexible adhesive layer can be less than or equal to 1.41. Furthermore, peel strength of the flexible adhesive layer is at least 10 N/25 mm. Accordingly, in the optical compensation film 2 of the instant example embodiment, the adhesive layer 22 can be omitted, and the optical compensation film 2 can be directly connected to the light-emitting assembly 1 through the first low refractive index layer 211.

When the first low refractive index layer 211 is a flexible adhesive layer, a UV light-cured layer or a heat cured layer, after a formation of the first low refractive index layer 211, a plurality of bubbles can be optionally formed in the inside of the first low refractive index layer 211, such that the first low refractive index layer 211 has a porous structure. The bubbles inside the first low refractive index layer 211 may slightly reduce the transparency of the optical compensation film 2, but the effect of the optical compensation film 2 on improving the color shift is not affected.

In this case, it should be noted that in the abovementioned equation: $|\theta 1-(180-2*(\arcsin(n_{L1}/n_{H1})*180/\pi))|\leq 10$, $n_{L1}$ represents an equivalent refractive index of the first low refractive index layer 211 having the bubbles. In actuality, the equivalent refractive index ($n_{L1}$) is greater than 1 and less than a theoretical refractive index of a material of the first low refractive index layer 211 due to the presence of the bubbles. The first low refractive index layer 211 is, for example, a flexible adhesive layer, a UV-light cured layer, or a heat cured layer. For example, if the theoretical refractive index of a material of the first low refractive index layer 211 is 1.41, the equivalent refractive index ($n_{L1}$) of the first low refractive index layer 211 would fall within a range from 1 to 1.41, i.e., $1<n_{L1}<1.41$, in which the equivalent refractive index ($n_{L1}$) varies as a ratio of volume occupied by the bubbles. Moreover, if it is assumed that the refractive index of the first high refractive index layer 210 is 1.68, the first angle θ1 which is calculated according to the abovementioned equation ranges from 80 degrees to 120 degrees, preferably, from 85 degrees to 100 degrees.

Figure 4:
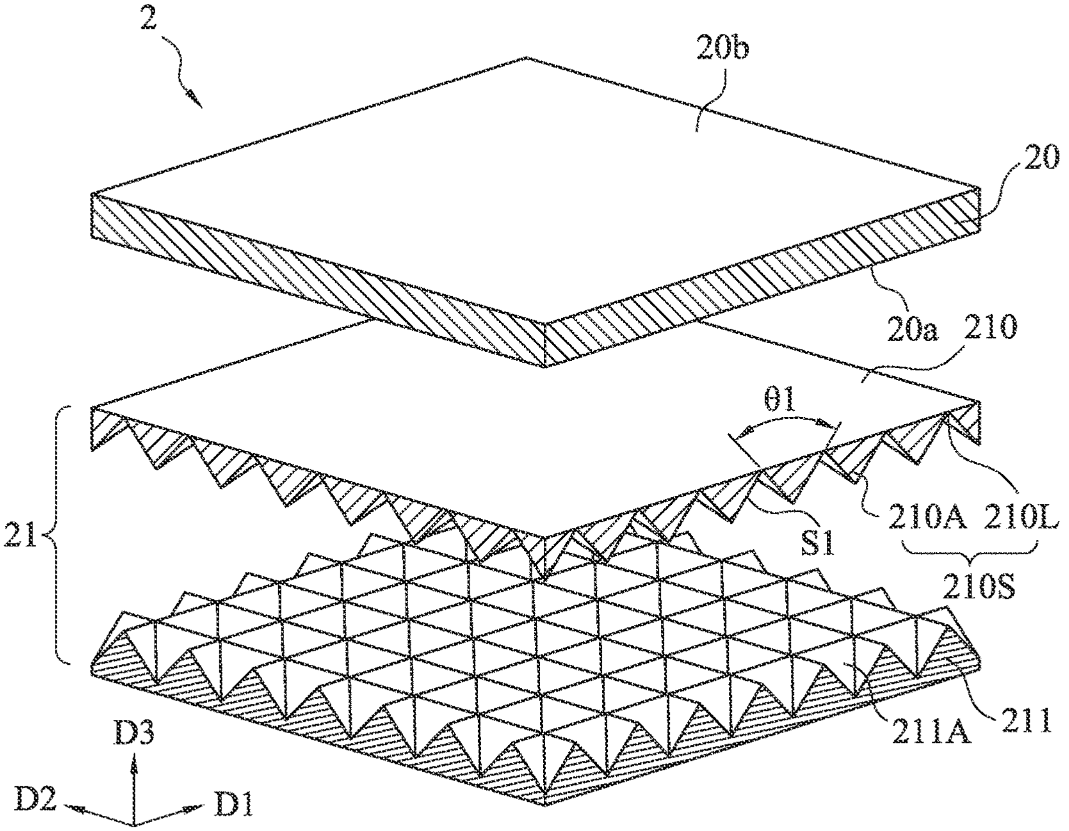
FIG. 4 is a schematic exploded perspective view of a part of an optical compensation film in accordance with another example embodiment.

Reference is made to FIG. 4, which is a schematic exploded perspective view of a part of an optical compensation film in accordance with another example embodiment. In the instant example embodiment, the first microstructure 210A of the first high refractive index layer 210 is formed in a convex pyramidal shape, that is, the first microstructure 210A protrudes outward and is oriented away from the base 20 relative to the first boundary line 210L. Accordingly, the surface of the first low refractive layer 211 includes recessed microstructures, and at least one of the recessed microstructures is formed in a concave pyramidal shape.

Reference is made to FIG. 1 in conjunction with FIG. 5, in which FIG. 5 is a schematic perspective view of a part of a first high refractive index layer in accordance with another example embodiment. When the first high refractive index layer 210 shown in FIG. 5 is disposed on the base 20, the first textured surface 210S of the first high refractive index layer 210 faces away from the base 20. In the instant example embodiment, the first microstructure 210A is a recessed microstructure. One or more first boundary lines 210L are wavy boundary lines, and the wavy boundary lines turn up and down in the thickness direction D3 of the first high refractive index layer 210. To be more specific, the first boundary line 210L periodically turns up and down in the instant example embodiment. Furthermore, a wavelength of the first boundary line 210L extending in the first direction D1 corresponds to one of the first microstructures 210A. Similarly, a wavelength of the first boundary line 210L extending in the second direction D2 also corresponds to one of the first microstructures 210A. However, a relationship between the dimension of the first microstructure 210A and the wavelength of the first boundary line 210L is not limited in the present disclosure.

It should be noted that the light-emitting units 10 of the light-emitting assembly 1 are usually arranged in an array. Since one or more first boundary lines 210L are wavy boundary lines, the light beams L of sub-pixels to be reflected and refracted at different angles while passing through the first microstructures 210A of the first optical structure 21, which can prevent the formation of moiré pattern on the displayed image and thus improve the quality of the displayed image.

Figure 7:
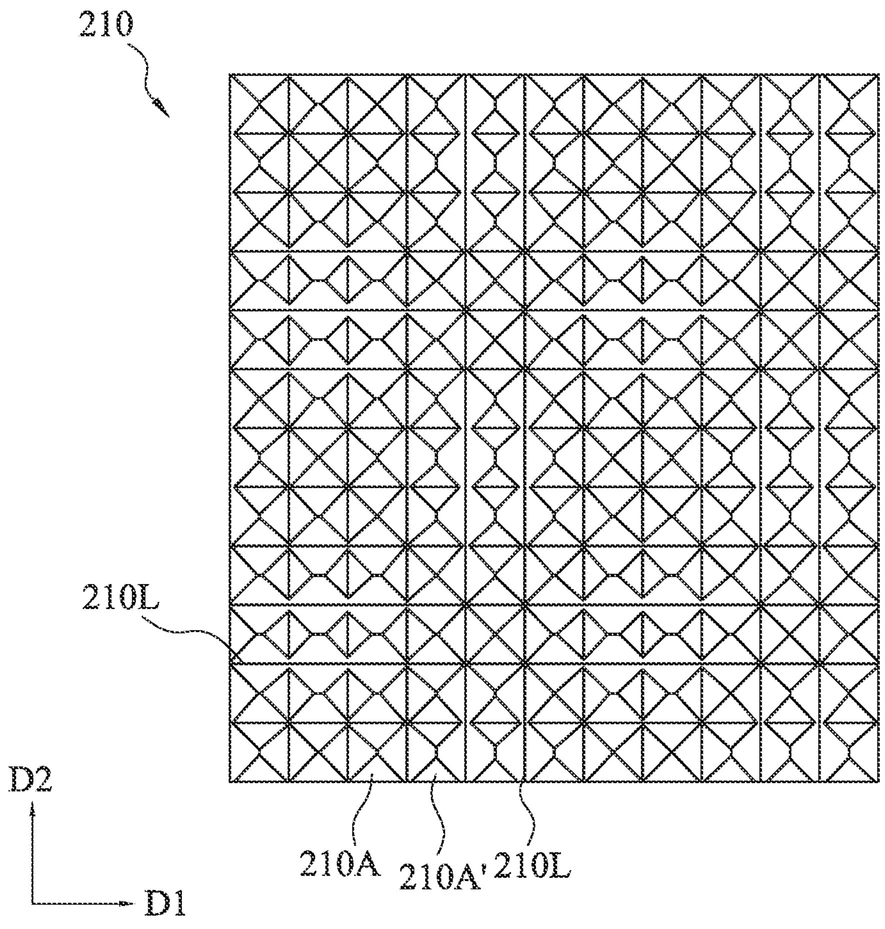
FIG. 7 is a schematic bottom view of the first high refractive index layer shown in FIG. 6.

Reference is made to FIG. 6 and FIG. 7, which are schematic perspective and bottom views of a part of a first high refractive index layer in accordance with another example embodiment, respectively. In the first high refractive index layer 210 of the instant example embodiment, the first boundary lines 210L can also be wavy boundary lines. Compared with the first high refractive index layer 210 of the example embodiment shown in FIG. 5, a waveform of the first boundary line 210L in the instant example embodiment has a longer wavelength. In other words, in the instant example embodiment, the wavelength of the first boundary line 210L extending in the first direction D1 (or the second direction D2) can correspond to multiple first microstructures 210A that are arranged in the first direction D1 (or the second direction D2). In addition, in the instant example embodiment, a notch 210*h* is formed at an intersection of one of the first boundary lines 210L extending in the first direction D1 and another one of the first boundary lines 210L extending in the second direction D2.

In the instant example embodiment, the first microstructures 210A are protruding microstructures. Furthermore, referring to FIG. 7, it is not necessary for the plurality of first microstructures 210A to have the same shape. That is to say, a portion of the plurality of first microstructures 210A may have different shape, dimension, or contour from that of another portion of the plurality of first microstructures 210A'. In the instant example embodiment, a portion of the plurality of first microstructures 210A are formed in convex pyramidal shapes, and another portion of the plurality of first microstructures 210A' are formed in convex prismatic shapes. The aforementioned convex prismatic shape may be a triangular prism or a tetrahedral prism. Moreover, the first microstructures 210A, 210A' that have different shapes, dimensions, or contours are randomly arranged, and at least two adjacent ones of the first microstructures 210A, 210A' have different shapes, dimensions, or contours.

Compared to the previous example embodiment (shown in FIG. 5), the first textured surface 210S of the instant example embodiment further includes a plurality of notches 210*h* that are located at intersections of the first boundary lines 210L, and the first microstructures 210A, 210A' formed in different shapes are randomly distributed over the light-emitting assembly 1, which results in a better effect on suppressing generation of moiré pattern on the displayed image, and further improves the image quality.

It should be noted that the wavy first boundary lines 210L can also horizontally turn left and right, which can also result in an effect on suppressing generation of moiré pattern on the displayed image.

Figure 8:
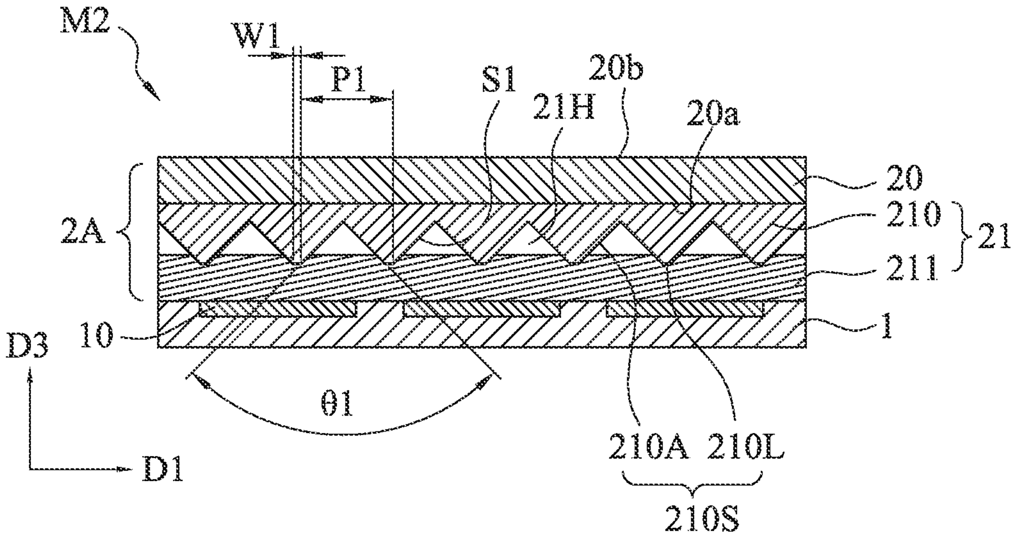
FIG. 8 is a schematic cross-sectional view of a light-emitting module in accordance with a second example embodiment of the present disclosure.
Figure 9:
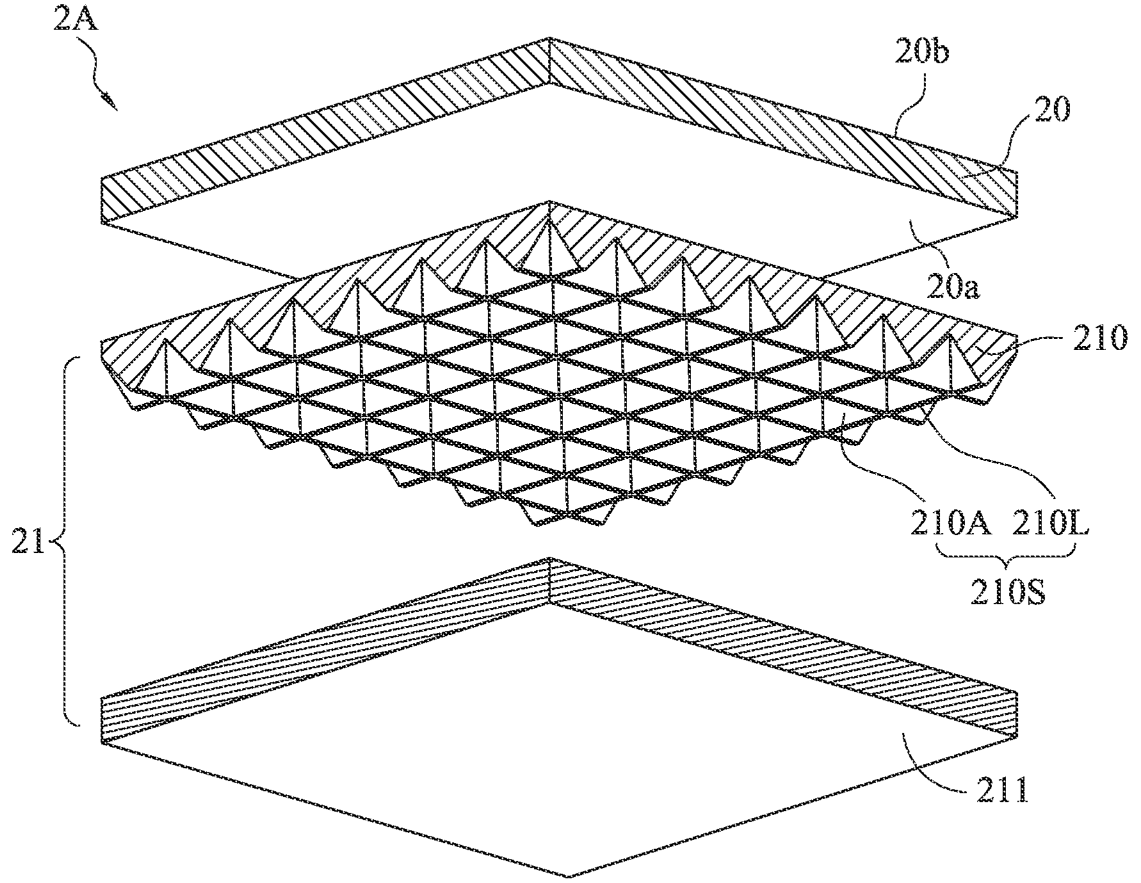
FIG. 9 is schematic perspective view of a part of the optical compensation film shown in FIG. 8.

Reference is made to FIG. 8 and FIG. 9, in which FIG. 8 is a schematic cross-sectional view of a light-emitting module in accordance with a second example embodiment of the present disclosure, and FIG. 9 is schematic perspective view of a part of the optical compensation film shown in FIG. 8. The elements of a light-emitting module M2 in the instant example embodiment the same as or similar to those of the light-emitting module M1 in the previous example embodiment are denoted by the same or similar reference numerals, and will not be reiterated herein.

In an optical compensation film 2A of one example embodiment, the first high refractive index layer 210 is a cured layer, and the first low refractive index layer 211 is a flexible adhesive layer. As mentioned previously, an optical clear adhesive (OCA) having a relatively low refractive index, such as silicone, can be selected to be used as the flexible adhesive layer, but the present disclosure is not limited thereto. For example, the refractive index of the flexible adhesive layer may be less than or equal to 1.41. Furthermore, peel strength of the flexible adhesive layer is at least 10N/25 mm. Accordingly, for the optical compensation film 2A, an additional adhesive layer can be omitted, and the optical compensation film 2A can be connected to the light-emitting assembly 1 directly by the first low refractive index layer 211.

It should be noted that compared to the situation of using a light cured layer or a heat cured layer to serve as the first low refractive index layer 211, by virtue of using the flexible adhesive layer to serve as the first low refractive index layer 211, the optical compensation film 2A has a better reliability. Specifically, since the flexible adhesive layer is softer and deformable, when the ambient temperature varies significantly, it can prevent the first high refractive index layer 210 and the flexible adhesive layer from being separated from each other due to an internal stress caused by a difference of thermal expansion coefficient. Accordingly, the optical compensation film 2A of the instant example embodiment can be implemented in a harsh working environment.

As shown in FIG. 8, the plurality of first microstructures 210A are recessed microstructures, and define a plurality of recessed spaces. In the instant example embodiment, the first low refractive index layer 211 does not completely fill at least one of the recessed spaces. In other words, the first low refractive index layer 211 only partially fills one or more recessed spaces so as to form at least one cavity 21H at bottom(s) of one or more first microstructures 210A. In one embodiment, multiple cavities 21H are formed between the first low refractive index layer 211 and the first high refractive index layer 210, and the cavities 21H are filled with air.

The first optical structure 21 of the optical compensation film 2A in the instant example embodiment has multiple cavities 21H. As such, compared to the previous example embodiment, the light beams L generated by the light-emitting assembly 1 are refracted more times while passing though the first optical structure 21. As such, the optical compensation film 2A exhibits a better light diffusion performance, but the optical compensation film 2A has a relatively lower transparency. However, in at least one of the first microstructures 210A of the instant example embodiment, the first angle θ1 between two opposite ones of the first inclined surfaces S1 and the total internal reflection critical angle θc still satisfy the equation: $|\theta 1-(180-2\theta c)|\leq 10$, such that the optical compensation film 2A can also be used to improve the color shift. Accordingly, the optical compensation film 2A can be implemented in an organic light-emitting diode (OLED) illumination apparatus. After an actual test in which the optical compensation film 2A of the instant example embodiment is applied in an OLED display apparatus or illumination apparatus and the results are observed by the naked eye, there is no color shift on the displayed image while the viewing angle exceeds 80 degrees.

As mentioned previously, due to the presence of the cavities 21H, the equivalent refractive index ($n_{L1}$) of the first low refractive index layer 211 is actually less than a theoretical refractive index of the material thereof. For example, if it is assumed that the first low refractive index layer 211 is a flexible adhesive layer and the theoretical refractive index of the material of the first low refractive index layer 211 is 1.41, the equivalent refractive index $n_{L1}$ of the first low refractive index layer 211 having the cavies 21H would fall within a range between 1 and 1.41, i.e., $1<n_{L1}<1.41$, in which the equivalent refractive index $n_{L1}$ varies as a ratio of volume occupied by the cavities 21H. Furthermore, assuming that the refractive index of the first high refractive index layer 210 is 1.68, the first angle θ1 calculated according to the aforementioned equation ranges from 80 degrees to 120 degrees, preferably, from 85 degrees to 100 degrees.

Reference is made to FIG. 8 and FIG. 9. In the instant example embodiment, one of the first boundary lines 210L of the first high refractive index layer 210 has a line width W1, and two adjacent ones of the first boundary lines 210L have a first pitch P1. Different from the previous example embodiment, the line width W1 of the first boundary line 210L in the instant example embodiment can be greater than or equal to 0.05 times the first pitch P1, and less than or equal to 0.2 times the first pitch P1, that is, the line width W1 and the first pitch P1 satisfy the following relationship: $0.05P1\leq W1\leq 0.2P1$. In one example embodiment, the first pitch P1 ranges from 20 μm to 30 μm. When the first pitch P1 is 20 μm, the line width W1 ranges from 1 μm to 4 μm.

It should be noted that in the example embodiment shown in FIG. 1, the line width W1 of the first boundary line 210L is approximately 0.02 times the first pitch P1. However, compared to the example embodiment shown in FIG. 1, the first high refractive index layer 210 of the instant example embodiment is in contact with both air and the first low refractive index layer 211. When the optical compensation film 2A is applied in an environment where the temperature may significantly varies, a bonding strength between the first high refractive index layer 210 and the first low refractive index layer 211 may be negatively affected due to the internal stress caused by the difference of thermal expansion coefficient. Accordingly, by virtue of the line width W1 of the first boundary line 210L being greater than or equal to 0.05 times the first pitch P1, an adhesive area between the first low refractive index layer 211 and the first high refractive index layer 210 can be increased so that the bonding strength therebetween is increased, thereby improving the reliability of the first optical structure 21.

Furthermore, by virtue of the line width W1 of the first boundary line 210L being less than or equal to 0.2 times first pitch P1, the effect of the optical compensation film 2A on improving the color shift can be prevented from being compromised too much. The first boundary line 210L can have a planar surface or a curved surface. In addition, as described in the previous example embodiments, the first boundary line 210L can be a wavy boundary line.

Figure 10:
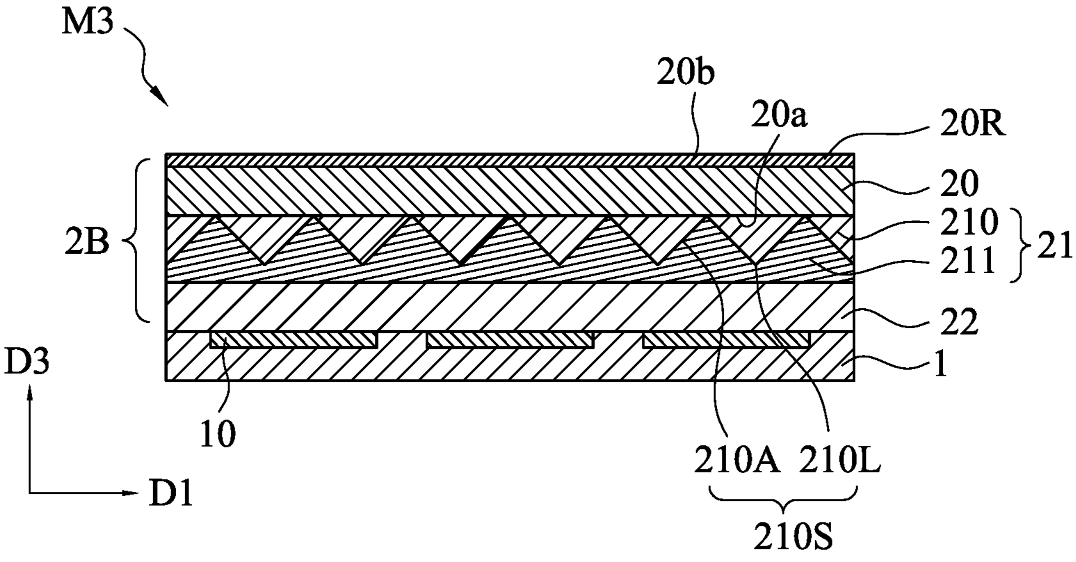
FIG. 10 is a schematic cross-sectional view of a light-emitting module in accordance with a third example embodiment of the present disclosure.

Reference is made to FIG. 10. In the light-emitting module M3 of the instant example embodiment, a surface of the base 20 of the optical compensation film 2B facing away from the first high refractive index layer 210 has a haze structure 20R formed thereon. That is to say, the haze structure 20R is located at the second side 20*b* of the base 20. The haze structure 20R has a haze value ranging from 5% to 95%. The haze structure 20R can be used to reduce surface reflection of light and increase luminance of the optical compensation film 2B. It should be noted that the higher the haze value of the haze structure 20, the lower the resolution of the displayed image. Accordingly, when the light-emitting module M3 is applied in the display apparatus, the haze value of the haze structure 20R preferably does not exceed 30% to prevent the resolution of the displayed image from being negatively affected. When the light-emitting module M3 is applied in the illumination apparatus, the haze value of the haze structure 20R can be greater than or equal to 30%, which can improve the luminance of the optical compensation film 2.

The haze structure 20R is formed by roughening the surface of the base 20 and/or the planar surface of the first low refractive index layer 211. In another example embodiment, the surface of the base 20 and/or the planar surface of the first low refractive index layer 211 can be directly formed to have a high roughness during fabrication processes of the base 20 or the first low refractive index layer 211. In another example embodiment, the surface of the base 20 and/or the planar surface of the first low refractive index layer 211 can be coated by a diffusion particle layer to form the haze structure 20R. Accordingly, means for forming the haze structure 20R are not limited in the present disclosure.

Figure 11:
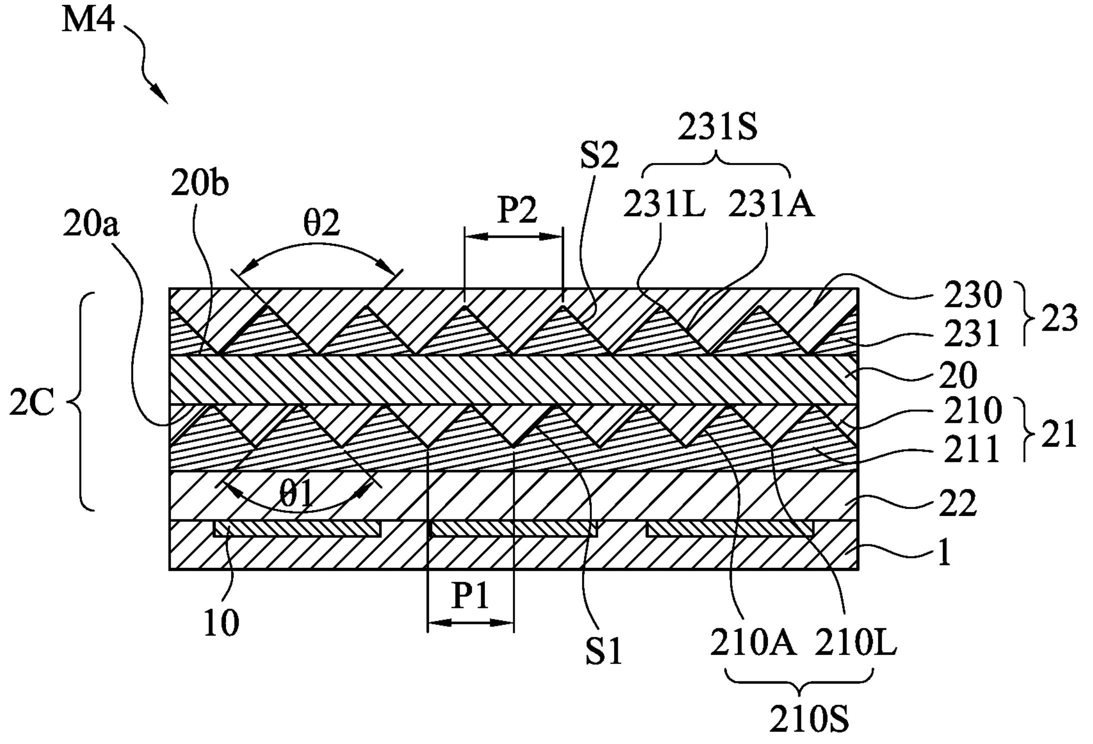
FIG. 11 is a schematic cross-sectional view of a light-emitting module in accordance with a fourth example embodiment of the present disclosure.
Figure 12:
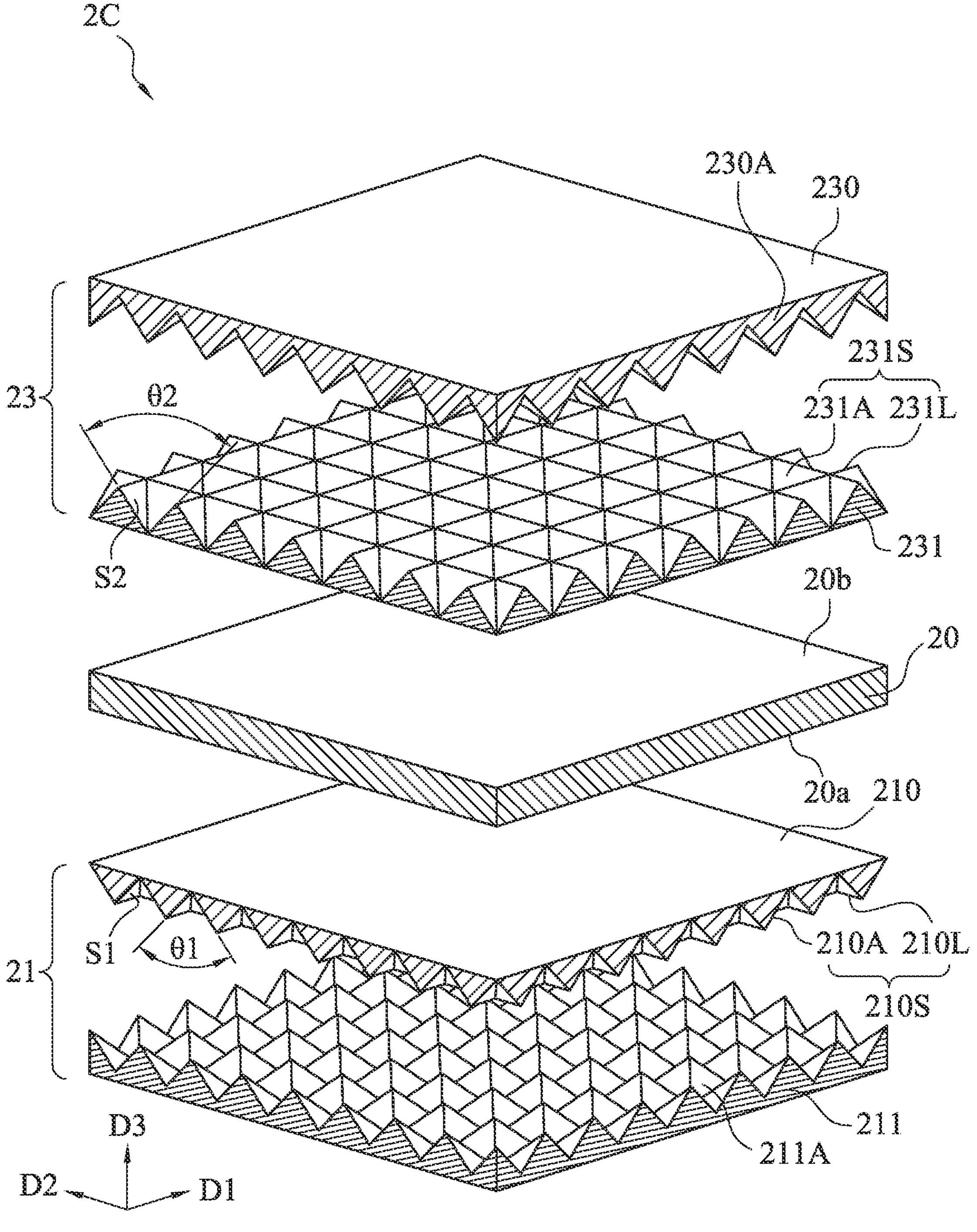
FIG. 12 is a schematic exploded perspective view of a part of the optical compensation film shown in FIG. 11.

Reference is made to FIG. 11 and FIG. 12. The elements of a light-emitting module M4 in the instant example embodiment the same as or similar to those of the light-emitting module M1 in the first example embodiment are denoted by the same or similar reference numerals, and will not be reiterated herein. In the instant example embodiment, the optical compensation film 2C further includes a second optical structure 23, and the second optical structure 23 and the first optical structure 21 are respectively located at two opposite sides of the base 20.

The second optical structure 23 of the instant example embodiment is located at the second side 20*b* of the base 20, and includes a second high refractive index layer 230 and a second low refractive index layer 231. The second low refractive index layer 231 is located between the base 20 and the second high refractive index layer 230. Accordingly, for the light beam L generated by the light-emitting assembly 1, the second high refractive index layer 230 is disposed downstream of the second low refractive index layer 231 on the optical path (of the light beam L generated by the light-emitting assembly 1 shown in FIG. 1). After entering the second optical structure 23, the light beam L generated by the light-emitting assembly 1 passes through the second low refractive index layer 231 and then passes through the second high refractive index layer 230 without being totally reflected in the second optical structure 23.

In the instant example embodiment, the second low refractive index layer 231 can be selected from materials whose refractive index $n_{L2}$ may range from 1.4 to 1.5, and the second low refractive index layer 231 is, for example, a cured layer formed by a UV light or heat curing process. The second high refractive index layer 230 can be selected from one of materials whose refractive index $n_{H2}$ may range from 1.58 to 1.7, and the second high refractive index layer 230 can be a flexible adhesive layer, or a cured layer formed by a UV light or heat curing process. When the second high refractive index layer 230 is a flexible adhesive layer (such as an optical clear adhesive), the flexible adhesive layer can include zirconium oxide nanoparticles, such that the refractive index of the flexible adhesive layer is greater than or equal to 1.6. In another example embodiment, the first high refractive index layer 210 can also include zirconium oxide nanoparticles.

Reference is made to FIG. 11. The second low refractive index layer 231 has a second textured surface 231S facing toward the second high refractive index layer 230. The second textured surface 231S includes a plurality of second microstructures 231A. Specifically, the second textured surface 231S has a plurality of second boundary lines 231L to define a plurality of second regions that are formed with the second microstructures 231A, respectively. The second microstructures 231A and the first microstructures 210A are different from each other in shape, dimension or contour. It is worth mentioning that in the instant example embodiment, a second pitch P2 between any two adjacent ones of the second boundary lines 231L is different from the first pitch P1 between any two adjacent ones of the first boundary lines 210L. In other words, the dimension of the first microstructure 210A is different from that of the second microstructure 231A. As such, the formation of moiré pattern on the displayed image can be prevented, thereby improving the image quality.

Reference is made to FIG. 12. In the instant example embodiment, the plurality of second boundary lines 231L intersect with one another to define the plurality of second regions. An extending direction (the first direction D1) of a portion of the plurality of second boundary lines 231L is not parallel to an extending direction (the second direction D2) of another portion of the plurality of second boundary lines 231L. It is worth mentioning that the extending direction of one of the second boundary lines 231L can also be different from the extending direction of one of the first boundary lines 210L so as to prevent the moiré pattern from occurring.

The second microstructure 231A is a recessed microstructure, i.e., the second microstructure 231A is depressed relative to the second boundary line 231L and oriented toward the base 20. At least one of the second microstructures 231A can include a plurality of second inclined surfaces S2, and the second inclined surfaces S2 are inclined relative to the thickness direction D3 of the second low refractive index layer 231. Referring to FIG. 11 again, a second angle θ2 formed between two opposite ones of the second inclined surfaces S2 satisfies the following equation: $|\theta 2-(180-2*\arcsin(n_{L2}/n_{H2})*180/\pi)|\leq 10$, in which θ2 represents the second angle, $n_{H2}$ represents the refractive index of the second high refractive index layer 230, and $n_{L2}$ represents the refractive index of the second low refractive index layer 231.

A total internal reflection critical angle θc' for ambient light entering from the second high refractive index layer 230 into the second low refractive index layer 231, the refractive index of the second high refractive index layer 230, and the refractive index of the second low refractive index layer 231 satisfy the following equation: $\theta c'=(\arcsin(n_{L2}/n_{H2})*180/\pi)$. Accordingly, in the instant example embodiment, a relationship between the second angle θ2 and the total internal reflection critical angle θc' can also be expressed as: $|\theta 2-(180-2\theta c')|\leq 10$; preferably, $|\theta 2-(180-2\theta c')|\leq 5$, such that the color shift phenomenon on the displayed image at a large viewing angle (greater than 60 degrees) can be suppressed.

As such, ambient light entering from the surface of the second high refractive index layer 230 can be prevented from being totally reflected as possible, and then a transparency of the optical compensation film 2C can be prevented from being decreased. That is to say, not only the optical compensation film 2C of the instant example embodiment can improve the color shift on the displayed image at a large viewing angle, but also the transparency of the optical compensation film 2C can be maintained at a required level. Furthermore, a ratio of the refractive index $n_{L2}$ of the second low refractive index layer 231 to the refractive index $n_{H2}$ of the second high refractive index layer 230 ranges from 0.8 to 0.95.

Moreover, in a preferable example embodiment, a difference (ΔN1) between the refractive index $n_{H1}$ of the first high refractive index layer 210 and the refractive index $n_{L1}$ of the first low refractive index layer 211 is greater than a difference (ΔN2) between the refractive index $n_{H2}$ of the second high refractive index layer 230 and the refractive index $n_{L2}$ of the second low refractive index layer 231, i.e., ΔN1>ΔN2. As such, by decreasing the difference ΔN2, the transparency of the optical compensation film 2C can be further increased.

At least one of the second microstructures 231A can be formed in a concave pyramidal shape or a concave prismatic shape, such as a concave pyramid, a concave triangular prism, or a concave quadrangular prism, and has the plurality of second inclined surfaces S2, but the present disclosure is not limited thereto. The second high refractive index layer 230 is a light cured layer, and a portion of the second high refractive index layer 230 fills the recessed spaces defined by the plurality of second microstructures 231A. As shown in FIG. 12, a surface of the second high refractive index layer 230 facing toward the second low refractive index layer 231 has a plurality of protruding microstructures 230A, and shapes of the protruding microstructure 230A can be mated with the second microstructures 231A. Since the second microstructures 231A of the instant example embodiment is formed in a concave pyramidal shape, the protruding microstructure 230A is formed in a convex pyramidal shape, but the present disclosure is not limited thereto.

In one example embodiment, the second high refractive index layer 230 can define cavities in the recessed spaces defined by the plurality of the second microstructures 231A, or the second high refractive index layer 230 can have a porous structure. Under this situation, for the abovementioned equation: $|\theta 2-(180-2*\arcsin(n_{L2}/n_{H2})*180/\pi)|\leq 10$, $n_{L2}$ represents an equivalent refractive index of the second high refractive index layer 230, and falls within a range between 1 and a theoretical refractive index of the material of the second high refractive index layer 230.

Figure 13:
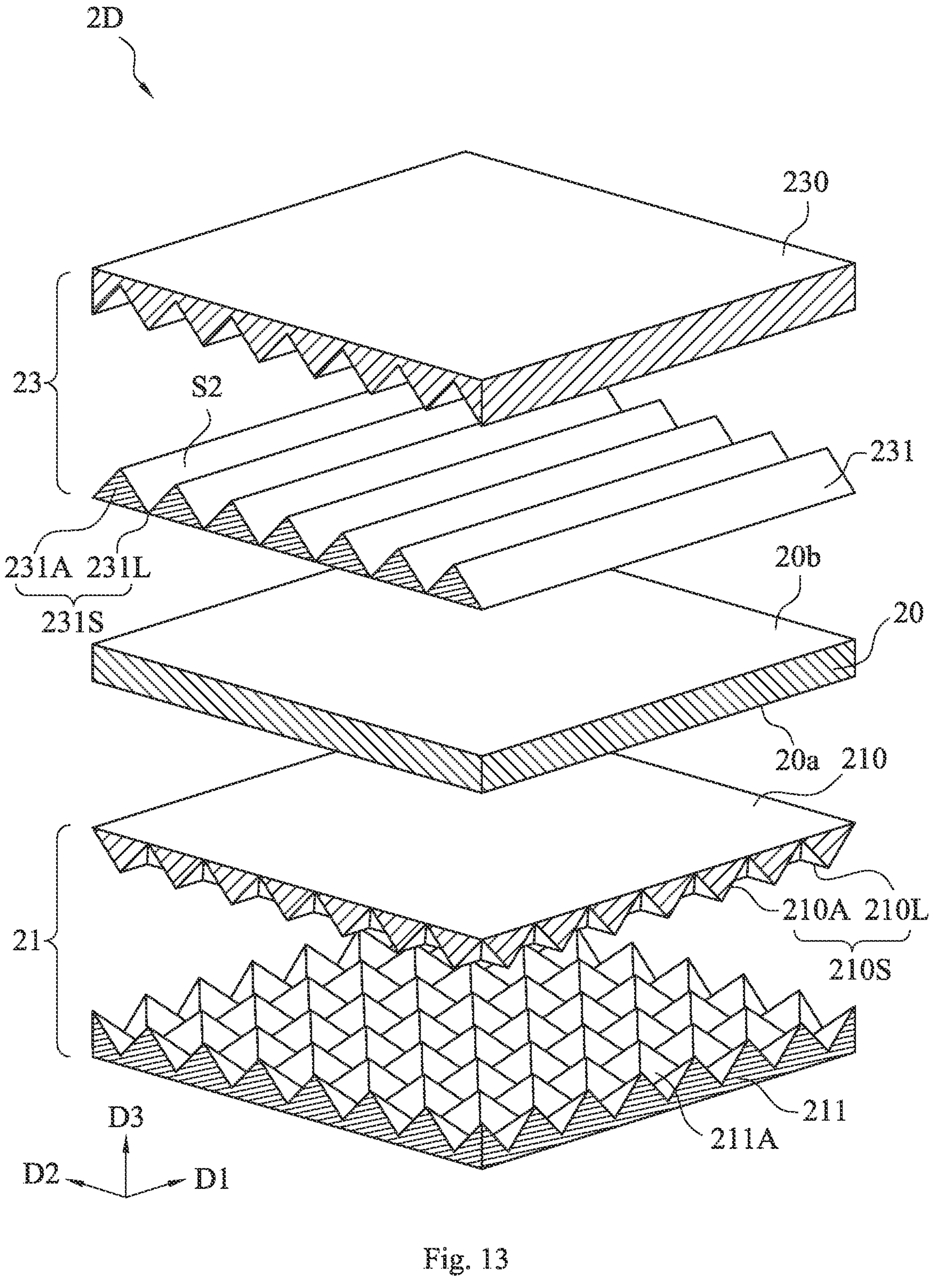
FIG. 13 is a schematic exploded perspective view of a part of an optical compensation film in accordance with another example embodiment.

Reference is made to FIG. 13, which is a schematic exploded perspective view of a part of an optical compensation film in accordance with another example embodiment. A difference between the optical compensation film 2D of the instant example embodiment and the optical compensation film 2C shown in FIG. 12 is that the second boundary lines 231L of the second low refractive index layer 231 in the instant example embodiment extend in the same direction (the first direction D1). At least one of the second microstructures 231A is in a strip shape and has two second inclined surfaces S2. In the instant example embodiment, at least one of the second microstructures 231A is formed in a convex prism, i.e., at least one of the second microstructures 231A protrudes from the second boundary lines 231L and is oriented away from the base 20. Furthermore, the structures of the first optical structure 21 and the second optical structure 23 both shown in FIG. 13 can be exchanged.

Figure 14:
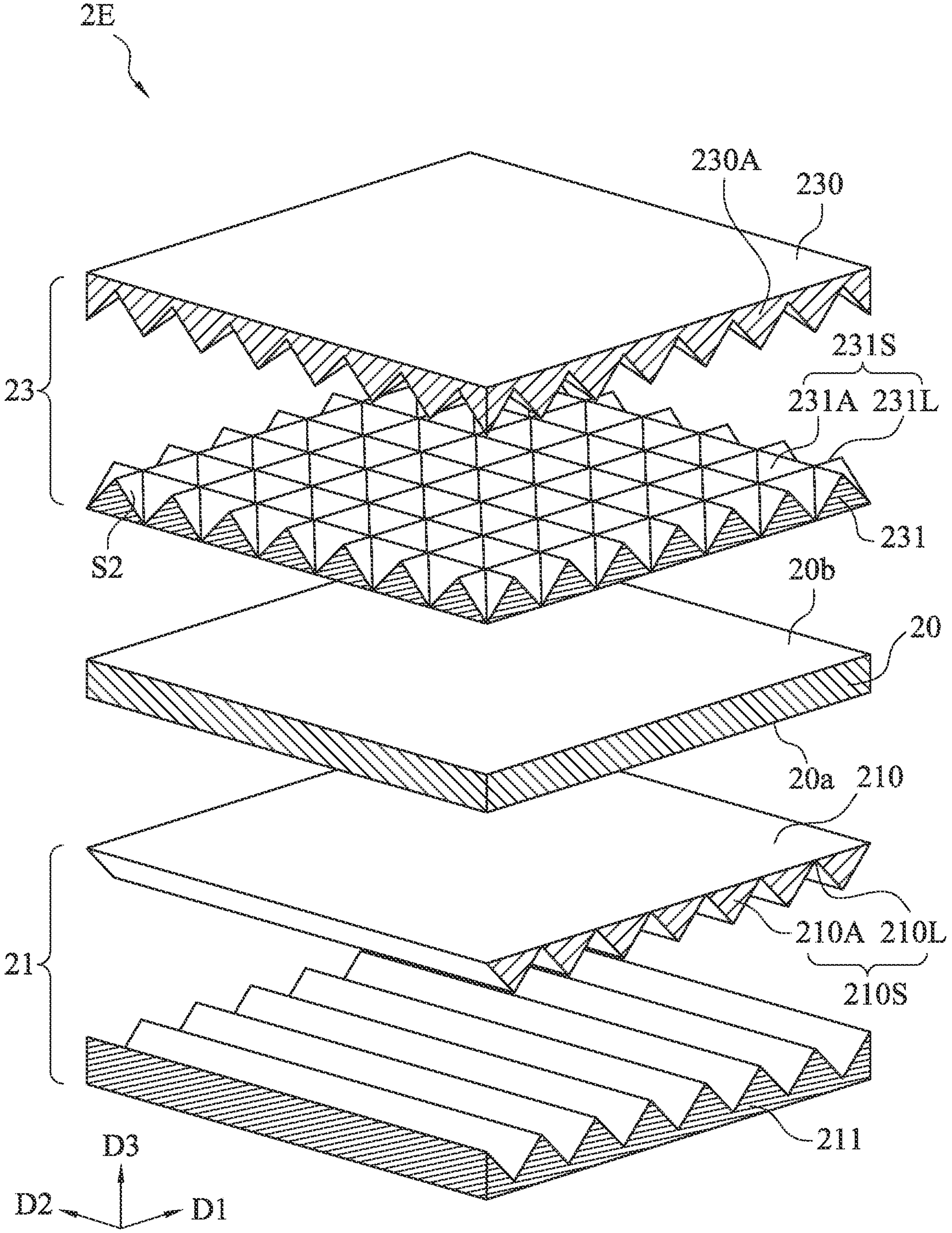
FIG. 14 is a schematic exploded perspective view of a part of an optical compensation film in accordance with another example embodiment.

Reference is made to FIG. 14. In the optical compensation film 2E of the instant example embodiment, the second optical structure 23 is the same as that shown in FIG. 12 and will not be reiterated herein. In the instant example embodiment, the first boundary lines 210L of the first high refractive index layer 210 extend along the same direction (the second direction D2), and at least one of the first microstructures 210A is formed in a convex prismatic shape.

Figure 15:
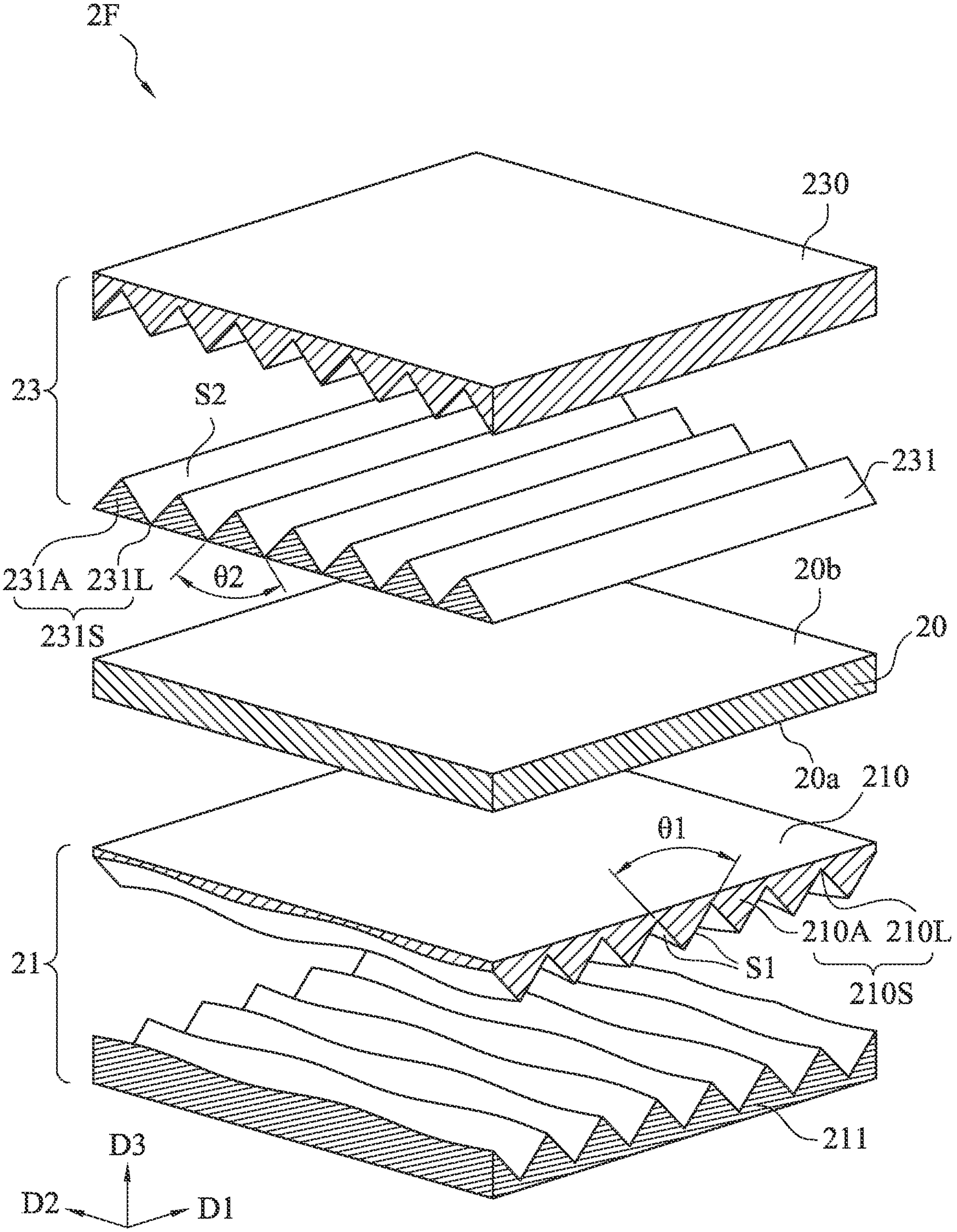
FIG. 15 is a partially schematic exploded perspective view of an optical compensation film in accordance with another example embodiment.

Reference is made to FIG. 15. In the optical compensation film 2F of the instant example embodiment, the second boundary lines 231L of the second low refractive index layer 231 substantially extend along the first direction D1, and the second microstructures 231A are each formed in a protrusion column also extending along the first direction D1. Furthermore, the first boundary lines 210L of the first high refractive index layer 210 substantially extend along the second direction D2, and the first microstructures 210A are each formed in a protrusion column also extending along the second direction D2. That is to say, the extending direction of the first boundary line 210L is different from the extending direction of the second boundary line 231L. Accordingly, orthogonal projections of the second microstructures 231A intersect with the first microstructures 210A. At least one of the second inclined surfaces S2 of the second microstructures 231A has different inclined direction from the inclined direction of any one of the first inclined surfaces S1.

As such, when implemented in display apparatus or illumination apparatus, the optical compensation film 2F of the instant example embodiment has effect on improving the color shift. Furthermore, at least one of the first boundary lines 210L and the second boundary lines 231L has a wavy shape. In the instant example embodiment, the first boundary lines 210L of the first high refractive index layer 210 are wavy, and the second boundary lines 231L are straight. In another example embodiment, the first boundary lines 210L and/or the second boundary lines 231L are wavy, which can prevent the formation of moiré pattern on the displayed image.

To be more specific, in at least one of the first microstructures 210A, the first angle θ1 between two of the first inclined surfaces S1 and the total internal reflection critical angle θc satisfy the equation: $|\theta 1-(180-2\theta c)|\leq 10$; or in at least one of the second microstructures 231A, the second angle θ2 between two of the second inclined surfaces S2 and the total internal reflection critical angle θc' satisfy the equation: $|\theta 2-(180-2\theta c')|\leq 10$. As such, the effect of the optical compensation film 2F on improving the color shift can be significantly enhanced.

Figure 16:
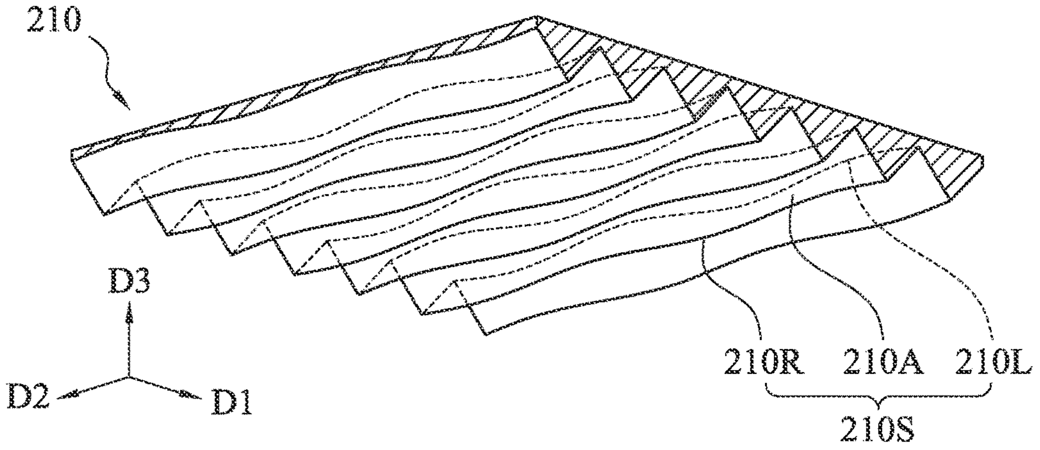
FIG. 16 is a schematic perspective view of the first high refractive index layer shown in FIG. 15.

The first high refractive index layer 210 is taken as an example for explaining different exemplary example embodiments in details in the following descriptions. Reference is made to FIG. 16, which is a schematic perspective view of the first high refractive index layer shown in FIG. 15. In the instant example embodiment, at least one of the first microstructures 210A is in a strip shape and protrudes outward relative to the first boundary lines 210L. At least one of the first microstructures 210A has a first ridge line 210R substantially extending along the first boundary line 210L.

Figure 17:
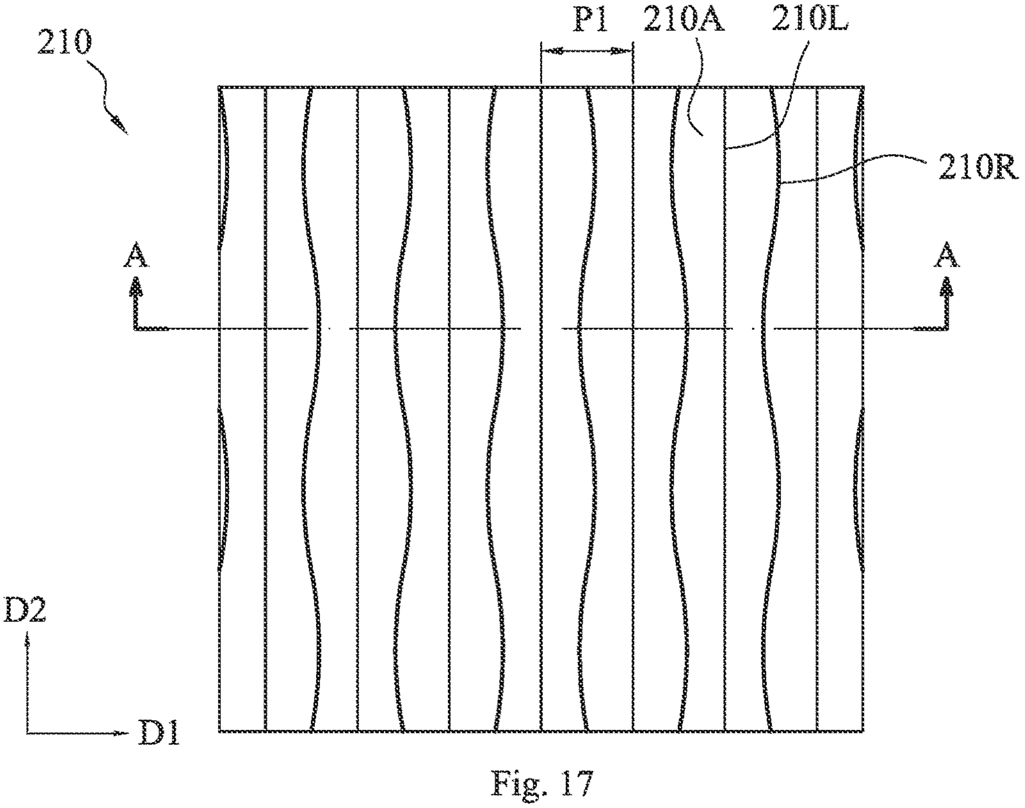
FIG. 17 is a schematic top view of the first high refractive index layer shown in FIG. 16.

Reference is made to FIG. 17, which is a schematic top view of the first high refractive index layer shown in FIG. 16. In the instant example embodiment, the first ridge line 210R is a wavy ridge line, and the first ridge line 210R turns left and right relative to first boundary lines 210L in a direction parallel to a surface. In other words, a distance in the first direction D1 between the first ridge line 210R and the first boundary line 201L adjacent to each other varies with locations of different points on the first ridge line 210R. Furthermore, a pitch between two adjacent ones of the first ridge lines 210R varies with locations of different points on one of the first ridge lines 210R. To be more specific, the pitch between the two adjacent first ridge lines 210R is a function of location of point on the first ridge lines 210R in the second direction D2.

Reference is made to FIG. 16 in conjunction with FIG. 17. In the instant example embodiment, the first pitch P1 between two adjacent ones of the first boundary lines 210L is maintained to be constant with different locations of the first microstructure 210A in the second direction D2, but the first boundary line 210L turns up and down in the thickness direction D3 of the first high refractive index layer 210.

Figure 18:
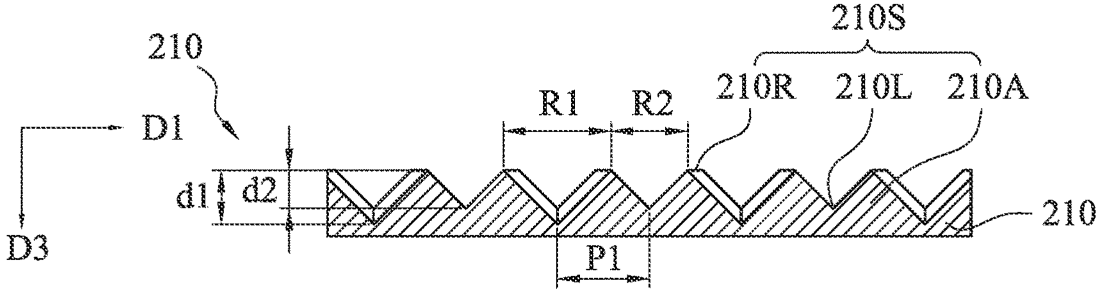
FIG. 18 is a schematic cross-sectional view of the first high refractive index layer shown in FIG. 17 taken along line A-A.

Reference is made to FIG. 18, which is a schematic cross-sectional view of the first high refractive index layer shown in FIG. 17 taken along line A-A. A cross-section of one of the first microstructures 210A, which is parallel to a plane defined by the first direction D1 and the thickness direction D3, still has a triangular-like shape.

Furthermore, any two adjacent ones of the first boundary lines 210L respectively have different depths relative to the first ridge line 210R, in which a depth d1 of one of the first boundary lines 210L is greater than a depth d2 of the other first boundary line 210L. It should be noted that at a location where the first boundary line 210L has a deeper depth, two of the first ridge lines 210R adjacent thereto also have a larger distance R1 therebetween. At a location where the first boundary line 210L has a shallower depth, two of the first ridge lines 210R adjacent thereto also have a smaller distance R2 therebetween.

Figure 19:
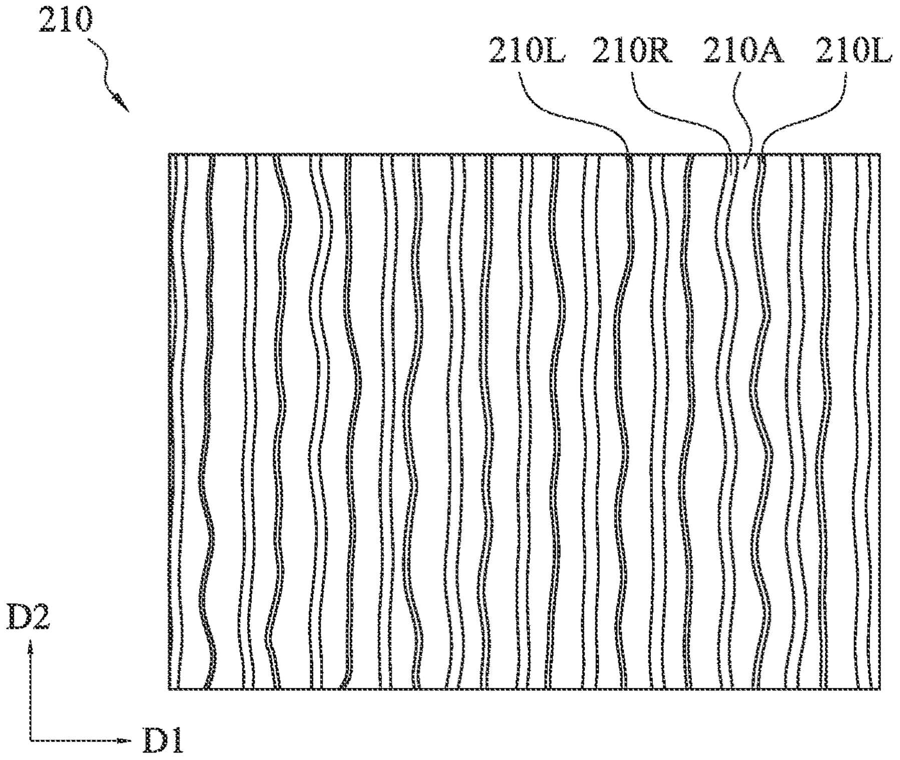
FIG. 19 is a partial schematic top view of a first high refractive index layer in accordance with another example embodiment.

Reference is made to FIG. 19, which is a partial schematic top view of a first high refractive index layer in accordance with another example embodiment. One of differences between the first high refractive index layers 210 respectively in the instant example embodiment and in the example embodiment shown in FIG. 16 is that both of the first boundary lines 210L and the first ridge lines 210R can be wavy curved lines each having a non-periodic contour. In other words, the first boundary lines 210L and the first ridge lines 210R irregularly turn left and right in a horizontal direction, and a relative height between one of the first ridge line 210R and one of the first boundary line 210L does not change with different locations in the second direction D2. In other words, the height of the first ridge line 210R relative to the first boundary line 210L is maintained to be constant along the second direction D2.

Figure 20:
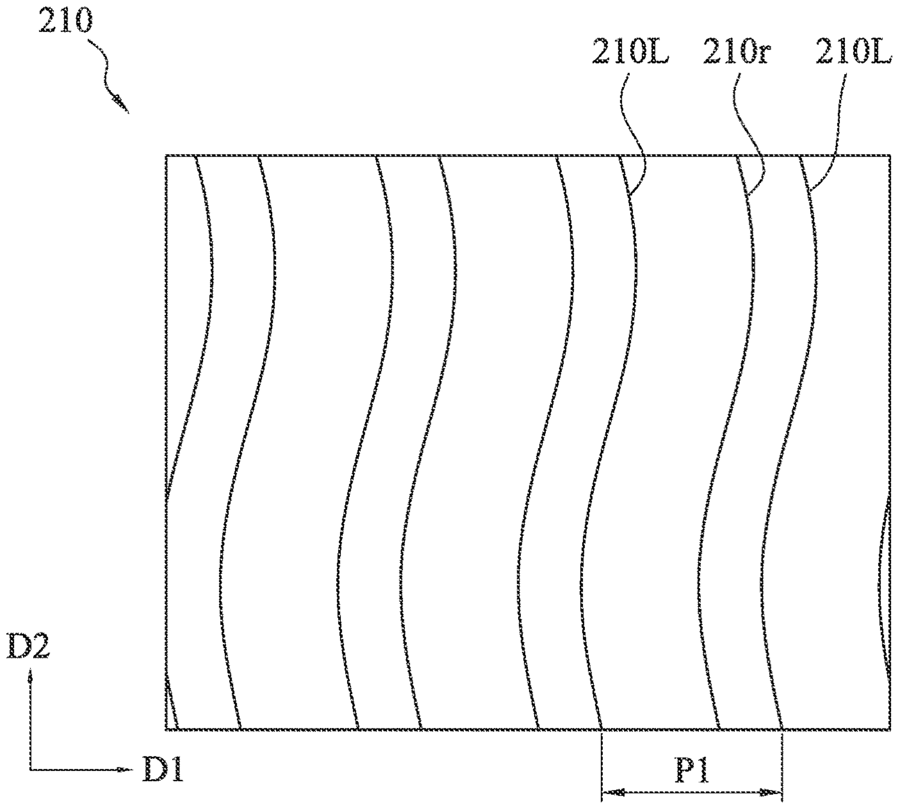
FIG. 20 is a partial schematic partial top view of a first high refractive index layer in accordance with another example embodiment.

Reference is made to FIG. 20, which is a partial schematic partial top view of a first high refractive index layer in accordance with another example embodiment. In the instant example embodiment, at least one of the first microstructures 210A is a recessed microstructure and has a first valley line 210*r* substantially extending in the second direction D2. The first boundary lines 210L and the first valley lines 210*r* are wavy curved lines each having a periodic contour and substantially the same waveform. Furthermore, a relative height between the first boundary line 210L and the first valley line 210*r* does not change with the locations along the second direction D2. In other words, a depth of the first valley line 210*r* relative to the first boundary line 210L is maintained to be constant along the second direction D2. In addition, the first pitch P1 between two adjacent ones of the first boundary lines 210L is also maintained to be constant along the second direction D2.

Figure 21:
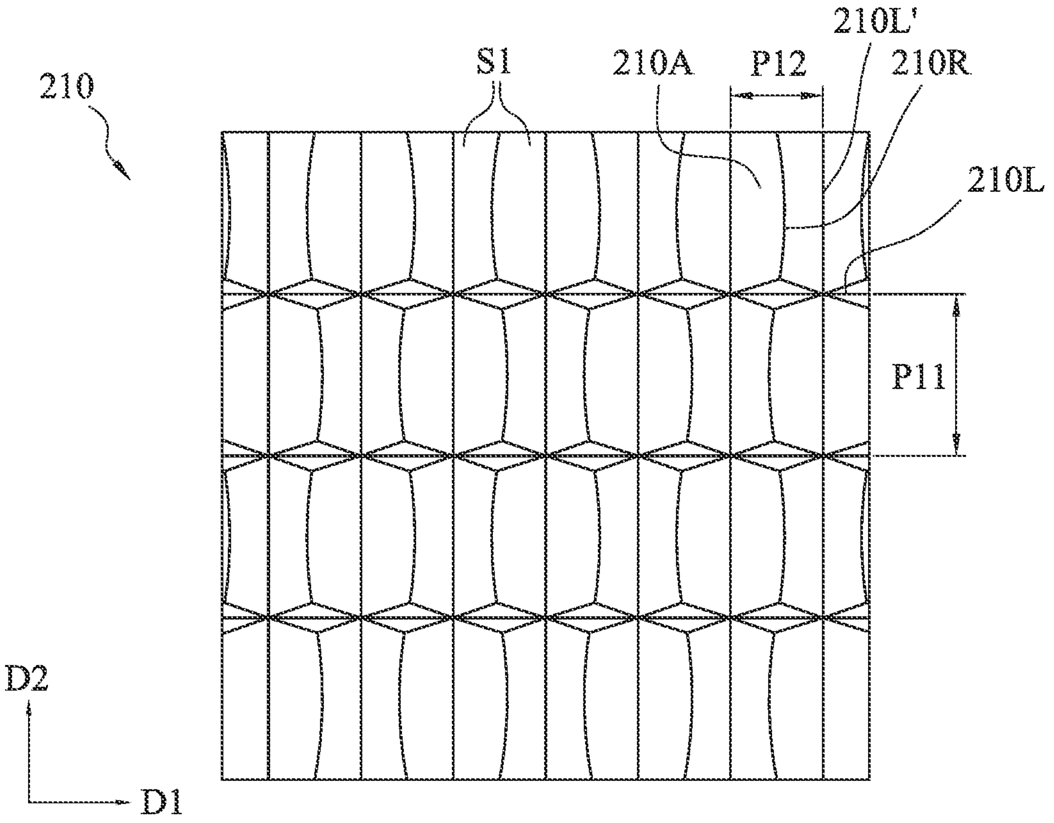
FIG. 21 is a partial schematic partial top view of a first high refractive index layer in accordance with another example embodiment.

Reference is made to FIG. 21, which is a partial schematic partial top view of a first high refractive index layer in accordance with another example embodiment. In the instant example embodiment, the first boundary lines 210L and 210L' intersect with each other to define the first regions, and each of the first regions is disposed with one of the first microstructures 210A. The first boundary lines 210L extend in the first direction D1, and another first boundary lines 210L' extend in the second direction D2. In the instant example embodiment, the first boundary lines 210L extending in the first direction D1 are straight, and the another first boundary lines 210L' extending in the second direction D2 each turn up and down in the thickness direction D3 of the first high refractive index layer 210. Furthermore, a pitch P11 between two adjacent ones of the first boundary lines 210L extending in the first direction D1 can be different from a pitch P12 between two adjacent ones of the another first boundary lines 210L' extending in the second direction D2.

In the instant example embodiment, at least one of the first microstructures 210A is formed in a convex prism and has a first ridge line 210R. As shown in FIG. 21, the first ridge line 210R is a curved line, and the first ridge lines 210R of two adjacent ones of the first microstructures 210A along the first direction D1 are bent toward different directions. It should be noted that a cross-section of the first microstructure 210A taken along the first direction D1 still has a triangular-like shape, as shown in FIG. 22.

Furthermore, at least one of the first microstructures 210A also has the first inclined surfaces S1 that are respectively inclined toward different directions, such that the light beams L with different wavelengths can be effectively dispersed and then mixed again in the base 20, thereby reducing the color shift at a large viewing angle. Furthermore, the first ridge lines 210R each having a curved shape allow the light beams L to be refracted or reflected at more variable angles, thereby preventing moiré pattern from being generated on the displayed image due to interference.

It should be noted that in the example embodiment shown in FIG. 14, the first high refractive index layer 210 can be replaced with any one of the first high refractive index layers 210 respectively shown in FIGS. 16 and 19-21. Furthermore, in the example embodiment shown in FIG. 15, the second low refractive index layer 231 can be replaced with another one including a structure the same as the structure of any one of the first high refractive index layers 210 respectively shown in FIGS. 16 and 19-21.

Figure 22:
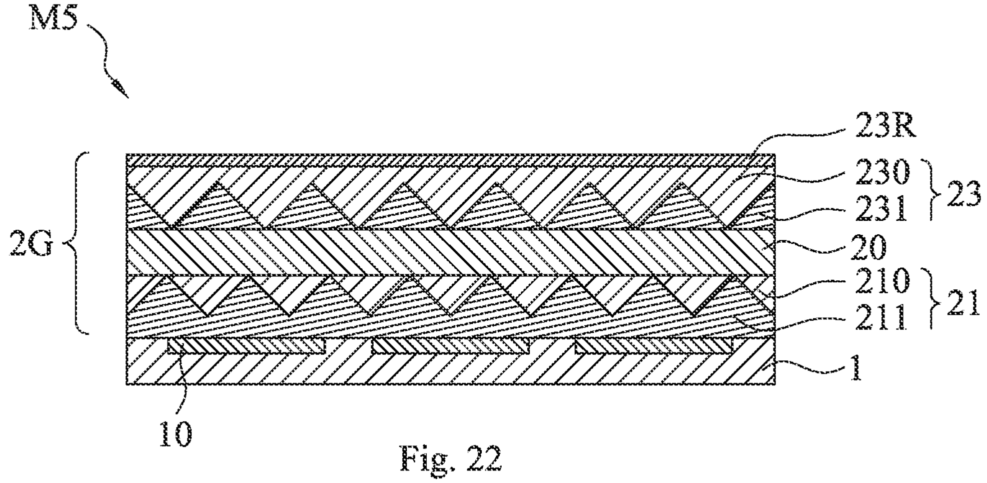
FIG. 22 is a schematic cross-sectional view of a light-emitting module in accordance with a fifth example embodiment of the present disclosure.

Reference is made to FIG. 22, which is a schematic cross-sectional view of a light-emitting module in accordance with a fifth example embodiment of the present disclosure. The elements of a light-emitting module M5 in the instant example embodiment the same as or similar to those of the light-emitting module M4 in the fourth example embodiment are denoted by the same or similar reference numerals, and will not be reiterated herein. In the optical compensation film 2G of the instant example embodiment, a haze structure 23R is also formed at a planar surface of the second high refractive index layer 230. The haze structure 23R has a haze value ranging from 5% to 95%. As mentioned previously, the haze structure 23R can be used to reduce surface reflection of light and increase luminance of the optical compensation film 2G. It should be noted that the higher the haze value of the haze structure 23R, the lower the resolution of the displayed image. Accordingly, when the light-emitting module M5 is applied in the display apparatus, the haze value of the haze structure 23R is preferably less than 30% to prevent the resolution of the displayed image from being negatively affected. When the light-emitting module M5 is applied in the illumination apparatus, the haze value of the haze structure 23R can be greater than or equal to 30%, which can improve the luminance of the optical compensation film 2G.

In addition, the first low refractive index layer 211 of the instant example embodiment can be a flexible adhesive layer (such as an optical clear adhesive). The optical compensation film 2G can be directly connected to the light-emitting assembly 1 by using the first low refractive index layer 211.

In conclusion, one of advantages of the present disclosure is that in the optical compensation films 2, 2A-2G, a display apparatus and illumination apparatus using the same that are provided in the present disclosure, by virtue of "the first high refractive index layer 210 being disposed downstream of the first low refractive index layer 211 on an optical path of a light beam L generated by a light-emitting assembly 1" and "at least one of the first microstructures 210, 210A' having two opposite first inclined surfaces S1 that form the first angle θ1 therebetween, in which the first angle θ1, the refractive index $n_{H1}$ of the first high refractive index layer 210, the refractive index $n_{L1}$ of the first low refractive index layer 211 satisfy the following equation: $|\theta 1-(180-2*(\arcsin(n_{L1}/n_{H1})*180/\pi))|\leq 10$," the color shift in a displayed image of the display or illumination apparatus at a large viewing angle (exceeding 45 degrees) can be reduced, thereby improving the display quality.

After actual tests in which at least one of the optical compensation films 2, 2A-2G is implemented in an OLED display or illumination apparatus and the displayed images are inspected by human eyes, the results show that each of the optical compensation films 2, 2A-2G can also suppress the color shift even though the viewing angle exceeds 80 degrees. Furthermore, a flexible OLED display or illumination apparatus, in which one of the optical compensation films 2, 2A-2G of the example embodiments in the present disclosure is implemented, is inspected by human eyes. When the flexible OLED display or illumination apparatus is bent, an area of the color shift which may be located at the edge region of the displayed image is significantly reduced, even no color shift is observed in the displayed image.

Moreover, in some example embodiments, by virtue of the first boundary lines 210L (or the second boundary lines 231L) of the first high refractive index layer 210 (or the second low refractive index layer 231) being wavy lines, or the ridge lines (or the valley lines) of the first microstructures 210A (or the second microstructures 231A) being wavy lines, or the first microstructures 210A (and/or the second microstructures 231A) having different shapes, dimensions, or contours, the displayed image can be prevented from the occurrence of moiré pattern so that the quality of the displayed image can be improved.

The foregoing descriptions disclosed above are merely the exemplary and feasible example embodiments of the present disclosure and not intended to limit the scope of the present disclosure. Accordingly, all variations and modifications of techniques made under the disclosures in the descriptions and drawings to achieve the equivalent effects are contained in the claimed scope of the present disclosure.

The invention claimed is:

1. An optical compensation film for use with a light-emitting assembly, comprising:

a base having a first side and a second side opposite to each other; and a first optical structure including a first high refractive index layer and a first low refractive index layer that are jointly located at the first side or the second side, wherein the first high refractive index layer is disposed downstream of the first low refractive index layer on an optical path of a light beam generated by the light-emitting assembly;

wherein the first high refractive index layer includes a plurality of first boundary lines at a first textured surface facing toward the first low refractive index layer, the first boundary lines intersect with one another to define a plurality of first regions, and the plurality of first regions are formed with a plurality of first microstructures;

wherein at least one of the first microstructures includes a plurality of first inclined surfaces, and two opposite ones of the first inclined surfaces jointly form a first angle therebetween, and the first angle, a refractive index of the first high refractive index layer, and a refractive index of the first low refractive index layer satisfy the following equation: $|\theta 1-(180-2*(\arcsin(n_{L1}/n_{H1})*180/\pi))|\leq 10$, in which θ1 represents the first angle, $n_{H1}$ represents the refractive index of the first high refractive index layer, and $n_{L1}$ represents the refractive index of the first low refractive index layer.

2. The optical compensation film according to claim 1, wherein a ratio (nL1/nH1) of the refractive index nL1 of the first low refractive index layer to the refractive index nH1 of the first high refractive index layer ranges from 0.8 to 0.95, and the first angle, the refractive index nH1 of the first high refractive index layer, and the refractive index nL1 of the first low refractive index layer further satisfy the following equation: $(180-2*(\arcsin(nL1/nH1)*180/\pi)<\theta 1$.

3. The optical compensation film according to claim 1, wherein two adjacent ones of the first boundary lines have a first pitch, and a line width of one of the first boundary lines is greater than or equal to 0.05 times the first pitch and less than 0.2 times the first pitch.

4. The optical compensation film according to claim 3, wherein the first microstructures define a plurality of recessed spaces, the first low refractive index layer is a flexible adhesive layer, a light cured layer, or a heat cured layer, and the first low refractive index layer defines at least one cavity in the first optical structure or has a porous structure.

5. The optical compensation film according to claim 1, further comprising: an adhesive layer attached to a surface of the first low refractive index layer, wherein the refractive index of the first low refractive index layer is greater than or equal to a refractive index of the adhesive layer.

6. The optical compensation film according to claim 1, wherein a portion of the plurality of first microstructures are different from another portion of the plurality of first microstructures in shape, dimension, or contour, and at least two adjacent ones of the first microstructures have different shapes, dimensions, or contours.

7. The optical compensation film according to claim 1, further comprising a second optical structure, wherein the first optical structure and the second optical structure are respectively located at two opposite sides of the base, and wherein the second optical structure includes:

a second high refractive index layer; and a second low refractive index layer disposed between the base and the second high refractive index layer, wherein the second low refractive index layer includes a plurality of second boundary lines at a second textured surface facing toward the second high refractive index layer to define a plurality of second regions, and the plurality of second regions are formed with a plurality of second microstructures; and wherein the second microstructures and the first microstructures are different from each other in shape, dimension, or contour.

8. The optical compensation film according to claim 7, wherein a first pitch between any two adjacent ones of the first boundary lines is different from a second pitch between any two adjacent ones of the second boundary lines.

9. The optical compensation film according to claim 7, wherein at least one of the first high refractive index layer and the second high refractive index layer includes zirconium oxide nanoparticles.

10. The optical compensation film according to claim 7, wherein a surface of the second high refractive index layer facing away from the second low refractive index layer has a haze structure, and the haze structure has a haze value ranging from 5% to 95%.

11. The optical compensation film according to claim 7, wherein at least one of the first boundary lines and the second boundary lines is a wavy boundary line, and the wavy boundary line turns up and down in a thickness direction of the base or turns left and right in a horizontal direction.

12. The optical compensation film according to claim 7, wherein at least one of the first microstructures or at least one of the second microstructures has a wavy ridge line or a wavy valley line.

13. The optical compensation film according to claim 7, wherein at least one of the second microstructures includes at least two second inclined surfaces that jointly form a second angle therebetween, and the second angle, a refractive index of the second high refractive index layer, and a refractive index of the second low refractive index layer satisfy the following equation: $|\theta 2-(180-2*\arcsin(n_{L2}/n_{H2})*180/\pi)|\leq 10$, in which θ2 represents the second angle, $n_{H2}$ represents the refractive index of the second high refractive index layer, and $n_{L2}$ represents the refractive index of the second low refractive index layer.

14. The optical compensation film according to claim 7, wherein the first high refractive index layer and the second low refractive index layer are both cured layers, and at least one of the first low refractive index layer and the second high refractive index layer is a flexible adhesive layer.

15. The optical compensation film according to claim 7, wherein a difference between the refractive index of the first high refractive index layer and the refractive index of the first low refractive index layer is greater than a difference between a refractive index of the second high refractive index layer and a refractive index of the second low refractive index layer.

16. The optical compensation film according to claim 1, wherein a surface located at the first side or the second side of the base and facing away from the first high refractive index layer has a haze structure, and the haze structure has a haze value ranging from 5% to 95%.

17. An optical compensation film for use with a light-emitting assembly, comprising:

a base having a first side and a second side opposite to each other; and a first optical structure including a first high refractive index layer and a first low refractive index layer that are jointly located at the first side or the second side, wherein the first high refractive index layer is disposed downstream of the first low refractive index layer on an optical path of a light beam generated by the light-emitting assembly;

wherein the first high refractive index layer is formed with a plurality of first microstructures at a first textured surface facing toward the first low refractive index layer, and the first microstructures define a plurality of recessed spaces, and wherein the first low refractive index layer fills the recessed spaces, and the first low refractive index layer defines at least one cavity in the first optical structure or has a porous structure, wherein at least one of the first microstructures includes a plurality of first inclined surfaces, two opposite ones of the first inclined surfaces jointly form a first angle therebetween, and the first angle ranges from 80 degrees to 120 degrees.

18. The optical compensation film according to claim 17, wherein the first angle, a refractive index of the first high refractive index layer, and a equivalent refractive index of the first low refractive index layer satisfy the following equation: $|\theta 1-(180-2*(\arcsin(n_{L1}/n_{H1})*180/\pi))|\leq 10$, in which θ1 represents the first angle, $n_{H1}$ represents the refractive index of the first high refractive index layer, and $n_{L1}$ represents the equivalent refractive index of the first low refractive index layer and ranges between 1 and a theoretical refractive index of a material of the first low refractive index layer.

19. An optical compensation film for use with a light-emitting assembly, comprising:

a base;

a first optical structure located at one side of the base and including a first high refractive index layer and a first low refractive index layer, wherein the first high refractive index layer is disposed downstream of the first low refractive index layer on an optical path of a light beam generated by the light-emitting assembly and includes a plurality of first microstructures at a first textured surface facing toward the first low refractive index layer, and at least one of the first microstructures includes at least two first inclined surfaces; and a second optical structure located at another side of the base and including a second high refractive index layer and a second low refractive index layer, wherein the second high refractive index layer is disposed downstream of the second low refractive index layer on the optical path, the second low refractive index layer includes a plurality of second microstructures at a second textured surface facing toward the second high refractive index layer, and at least one of the second microstructures includes at least two second inclined surfaces;

wherein inclined directions of the at least two second inclined surfaces are different from an inclined direction of any one of the at least two first inclined surfaces, and wherein the at least two first inclined surfaces jointly form a first angle therebetween, and the first angle, a refractive index of the first high refractive index layer, and a refractive index of the first low refractive index layer satisfy the following equation: $|\theta 1-(180-2*(\arcsin(n_{L1}/n_{H1})*180/\pi))|\leq 10$, in which θ1 represents the first angle, nH1 represents the refractive index of the first high refractive index layer, and nL1 represents the refractive index of the first low refractive index layer.

* * * * *